United States Patent
Hamaguchi et al.

(10) Patent No.: US 12,027,464 B2
(45) Date of Patent: Jul. 2, 2024

(54) SEMICONDUCTOR MODULE PARALLEL CIRCUIT AND SEMICONDUCTOR MODULE CONNECTION SUBSTRATE

(71) Applicant: Mitsubishi Electric Corporation, Tokyo (JP)

(72) Inventors: Ryota Hamaguchi, Tokyo (JP); Yasushi Nakayama, Tokyo (JP); Shuichi Nagamitsu, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 485 days.

(21) Appl. No.: 17/593,718

(22) PCT Filed: Mar. 29, 2019

(86) PCT No.: PCT/JP2019/014076
§ 371 (c)(1),
(2) Date: Sep. 23, 2021

(87) PCT Pub. No.: WO2020/202272
PCT Pub. Date: Oct. 8, 2020

(65) Prior Publication Data
US 2022/0173043 A1    Jun. 2, 2022

(51) Int. Cl.
*H01L 23/64* (2006.01)
*H01L 23/538* (2006.01)
(Continued)

(52) U.S. Cl.
CPC ........ *H01L 23/5383* (2013.01); *H01L 25/105* (2013.01)

(58) Field of Classification Search
None
See application file for complete search history.

(56) References Cited

U.S. PATENT DOCUMENTS 8,618,632 B2* 12/2013 Kawashima ........ H01L 27/0694
257/532
9,412,674 B1* 8/2016 Kim .................... H01L 22/34
(Continued)

FOREIGN PATENT DOCUMENTS

| JP | H09261948 A | 10/1997 |
|---|---|---|
| JP | 2014027831 A | 2/2014 |
| WO | 2019016929 A1 | 1/2019 |

OTHER PUBLICATIONS

Office Action dated Mar. 25, 2022, issued in corresponding Indian Patent Application No. 202127043465, 6 pages.
(Continued)

*Primary Examiner* — Eric A. Ward
(74) *Attorney, Agent, or Firm* — BUCHANAN INGERSOLL & ROONEY PC

(57) ABSTRACT

A semiconductor module parallel circuit includes: a plurality of power semiconductor modules; and a multilayer substrate that interconnects the plurality of power semiconductor modules, each of the power semiconductor modules includes: a power semiconductor switching element; a first signal terminal connected to a gate potential of the power semiconductor switching element; and a second signal terminal connected to a source potential of the power semiconductor switching element, the multilayer substrate includes: an external connection terminal; first signal terminal connection patterns connected to the first signal terminals of the power semiconductor modules; and second signal terminal connection patterns connected to the second signal terminals of the power semiconductor modules, and inductances of gate wiring for the plurality of power semiconductor modules, from the external connection terminal to the first signal terminal connection pattern and from the second
(Continued)

signal terminal connection pattern to the external connection terminal are equal to one another.

3 Claims, 9 Drawing Sheets

(51) Int. Cl.
    *H01L 25/07*     (2006.01)
    *H01L 25/10*     (2006.01)

(56) References Cited

U.S. PATENT DOCUMENTS

| | | |
|---|---|---|
| 9,479,083 B2 | 10/2016 | Makita et al. |
| 2014/0029323 A1 | 1/2014 | Makita et al. |
| 2018/0062532 A1* | 3/2018 | Maruyama ............ H02M 7/003 |
| 2019/0237416 A1* | 8/2019 | Gao .................. H01L 23/49827 |
| 2019/0371746 A1* | 12/2019 | Mahon .................... H01L 23/66 |
| 2021/0143136 A1 | 5/2021 | Usui |

OTHER PUBLICATIONS

International Search Report (PCT/ISA/210) with English translation and Written Opinion (PCT/ISA/237) mailed on Jun. 18, 2019, by the Japan Patent Office as the International Searching Authority for International Application No. PCT/JP2019/014076.

* cited by examiner

SEMICONDUCTOR MODULE PARALLEL CIRCUIT AND SEMICONDUCTOR MODULE CONNECTION SUBSTRATE

FIELD

The present invention relates to a semiconductor module parallel circuit and a semiconductor module connection substrate.

BACKGROUND

A technique for driving parallel-connected semiconductor switching elements is known in, for example, Patent Literature 1. Patent Literature 1 discloses that twisted cables, which are gate wiring to two IGBTs, are laid adjacent to connection lines, such that electromotive forces generated in the twisted cables and polarities thereof are substantially equal to one another and gate-emitter voltages of the individual elements substantially are equal to one another, thereby providing balanced currents flowing through the individual elements.

CITATION LIST

Patent Literature

Patent Literature 1: Japanese Patent Application Laid-open No. H9-261948

SUMMARY

Technical Problem

In recent years, susceptibility to the influence of inductance is increased with an increase in the speed of switching. Patent Literature 1 does not allow for the influence of inductance. When a difference in inductance occurs between the semiconductor elements, an imbalance in the amount of current flowing through individual semiconductor elements occurs. Upon occurrence of such an imbalance in the current flowing through the semiconductor elements, a larger amount of current flows in one of the semiconductor elements, which leads to a shortened lifetime of the semiconductor.

Solution to Problem

A semiconductor module parallel circuit of a first invention comprises: a first power semiconductor module; a second power semiconductor module; and a multilayer substrate to interconnect a plurality of the power semiconductor modules, wherein each of the power semiconductor modules includes: a power semiconductor switching element; a first signal terminal connected to a gate potential of the power semiconductor switching element; and a second signal terminal connected to a source potential of the power semiconductor switching element, the multilayer substrate includes: an external connection terminal; a first signal terminal connection pattern for the first power semiconductor module, the first signal terminal connection pattern for the first power semiconductor module being connected to the first signal terminal of the first power semiconductor module; a second signal terminal connection pattern for the first power semiconductor module, the second signal terminal connection pattern for the first power semiconductor module being connected to the second signal terminal of the first power semiconductor module; a first signal terminal connection pattern for the second power semiconductor module, the first signal terminal connection pattern for the second power semiconductor module being connected to the first signal terminal of the second power semiconductor module; and a second signal terminal connection pattern for the second power semiconductor module, the second signal terminal connection pattern for the second power semiconductor module being connected to the second signal terminal of the second power semiconductor module, and an inductance of gate wiring for the first power semiconductor module from the external connection terminal to the first signal terminal connection pattern for the first power semiconductor module and from the second signal terminal connection pattern for the first power semiconductor module to the external connection terminal, and an inductance of gate wiring for the second power semiconductor module from the external connection terminal to the first signal terminal connection pattern for the second power semiconductor module and from the second signal terminal connection pattern for the second power semiconductor module to the external connection terminal are equal to each other.

A semiconductor module parallel circuit of a second invention comprises: a first power semiconductor module; a second power semiconductor module; and a multilayer substrate to interconnect a plurality of the power semiconductor modules, wherein each of the power semiconductor modules includes: a power semiconductor switching element; a first signal terminal connected to a gate potential of the power semiconductor switching element; and a second signal terminal connected to a source potential of the power semiconductor switching element, the multilayer substrate includes: an external connection terminal; a first signal terminal connection pattern for the first power semiconductor module, the first signal terminal connection pattern for the first power semiconductor module being connected to the first signal terminal of the first power semiconductor module; a second signal terminal connection pattern for the first power semiconductor module, the second signal terminal connection pattern for the first power semiconductor module being connected to the second signal terminal of the first power semiconductor module; a first signal terminal connection pattern for the second power semiconductor module, the first signal terminal connection pattern for the second power semiconductor module being connected to the first signal terminal of the second power semiconductor module; and a second signal terminal connection pattern for the second power semiconductor module, the second signal terminal connection pattern for the second power semiconductor module being connected to the second signal terminal of the second power semiconductor module, and a length of gate wiring for the first power semiconductor module from the external connection terminal to the first signal terminal connection pattern for the first power semiconductor module and from the second signal terminal connection pattern for the first power semiconductor module to the external connection terminal, and a length of gate wiring for the second power semiconductor module from the external connection terminal to the first signal terminal connection pattern for the second power semiconductor module and from the second signal terminal connection pattern for the second power semiconductor module to the external connection terminal are equal to each other.

A semiconductor module connection substrate of a third invention comprises: an external connection terminal; a first signal terminal connection pattern for a first power semiconductor module, the first signal terminal connection pattern for the first power semiconductor module being provided for connection to a first signal terminal of the first power semiconductor module; a second signal terminal connection pattern for the first power semiconductor module, the second signal terminal connection pattern for the first power semiconductor module being provided for connection to a second signal terminal of the first power semiconductor module; a first signal terminal connection pattern for a second power semiconductor module, the first signal terminal connection pattern for the second power semiconductor module being provided for connection to a first signal terminal of the second power semiconductor module; and a second signal terminal connection pattern for the second power semiconductor module, the second signal terminal connection pattern for the second power semiconductor module being provided for connection to a second signal terminal of the second power semiconductor module, wherein an inductance of gate wiring for the first power semiconductor module from the external connection terminal to the first signal terminal connection pattern for the first power semiconductor module and from the second signal terminal connection pattern for the first power semiconductor module to the external connection terminal, and an inductance of gate wiring for the second power semiconductor module from the external connection terminal to the first signal terminal connection pattern for the second power semiconductor module and from the second signal terminal connection pattern for the second power semiconductor module to the external connection terminal are equal to each other.

Advantageous Effects of Invention

A semiconductor module parallel circuit according to the first invention comprises: a first power semiconductor module; a second power semiconductor module; and a multilayer substrate to interconnect a plurality of the power semiconductor modules, wherein each of the power semiconductor modules includes: a power semiconductor switching element; a first signal terminal connected to a gate potential of the power semiconductor switching element; and a second signal terminal connected to a source potential of the power semiconductor switching element, the multilayer substrate includes: an external connection terminal; a first signal terminal connection pattern for the first power semiconductor module, the first signal terminal connection pattern for the first power semiconductor module being connected to the first signal terminal of the first power semiconductor module; a second signal terminal connection pattern for the first power semiconductor module, the second signal terminal connection pattern for the first power semiconductor module being connected to the second signal terminal of the first power semiconductor module; a first signal terminal connection pattern for the second power semiconductor module, the first signal terminal connection pattern for the second power semiconductor module being connected to the first signal terminal of the second power semiconductor module; and a second signal terminal connection pattern for the second power semiconductor module, the second signal terminal connection pattern for the second power semiconductor module being connected to the second signal terminal of the second power semiconductor module, and an inductance of gate wiring for the first power semiconductor module from the external connection terminal to the first signal terminal connection pattern for the first power semiconductor module and from the second signal terminal connection pattern for the first power semiconductor module to the external connection terminal, and an inductance of gate wiring for the second power semiconductor module from the external connection terminal to the first signal terminal connection pattern for the second power semiconductor module and from the second signal terminal connection pattern for the second power semiconductor module to the external connection terminal are equal to each other. As a result, it is possible to reduce an imbalance in current between the semiconductor modules, and to reduce shortening of the lifetime of semiconductor elements.

A semiconductor module parallel circuit according to the second invention comprises: a first power semiconductor module; a second power semiconductor module; and a multilayer substrate to interconnect a plurality of the power semiconductor modules, wherein each of the power semiconductor modules includes: a power semiconductor switching element; a first signal terminal connected to a gate potential of the power semiconductor switching element; and a second signal terminal connected to a source potential of the power semiconductor switching element, the multilayer substrate includes: an external connection terminal; a first signal terminal connection pattern for the first power semiconductor module, the first signal terminal connection pattern for the first power semiconductor module being connected to the first signal terminal of the first power semiconductor module; a second signal terminal connection pattern for the first power semiconductor module, the second signal terminal connection pattern for the first power semiconductor module being connected to the second signal terminal of the first power semiconductor module; a first signal terminal connection pattern for the second power semiconductor module, the first signal terminal connection pattern for the second power semiconductor module being connected to the first signal terminal of the second power semiconductor module; and a second signal terminal connection pattern for the second power semiconductor module, the second signal terminal connection pattern for the second power semiconductor module being connected to the second signal terminal of the second power semiconductor module, and a length of gate wiring for the first power semiconductor module from the external connection terminal to the first signal terminal connection pattern for the first power semiconductor module and from the second signal terminal connection pattern for the first power semiconductor module to the external connection terminal, and a length of gate wiring for the second power semiconductor module from the external connection terminal to the first signal terminal connection pattern for the second power semiconductor module and from the second signal terminal connection pattern for the second power semiconductor module to the external connection terminal are equal to each other. As a result, it is possible to reduce an imbalance in current between the semiconductor modules, and to reduce shortening of the lifetime of semiconductor elements.

A semiconductor module connection substrate according to the third invention comprises: an external connection terminal; a first signal terminal connection pattern for a first power semiconductor module, the first signal terminal connection pattern for the first power semiconductor module being provided for connection to a first signal terminal of the first power semiconductor module; a second signal terminal connection pattern for the first power semiconductor module, the second signal terminal connection pattern for the first power semiconductor module being provided for connection to a second signal terminal of the first power semiconductor module; a first signal terminal connection pattern for a second power semiconductor module, the first signal terminal connection pattern for the second power semiconductor module being provided for connection to a first signal terminal of the second power semiconductor module; and a second signal terminal connection pattern for the second power semiconductor module, the second signal terminal connection pattern for the second power semiconductor module being provided for connection to a second signal terminal of the second power semiconductor module, wherein an inductance of gate wiring for the first power semiconductor module from the external connection terminal to the first signal terminal connection pattern for the first power semiconductor module and from the second signal terminal connection pattern for the first power semiconductor module to the external connection terminal, and an inductance of gate wiring for the second power semiconductor module from the external connection terminal to the first signal terminal connection pattern for the second power semiconductor module and from the second signal terminal connection pattern for the second power semiconductor module to the external connection terminal are equal to each other. As a result, it is possible to reduce an imbalance in current between the semiconductor modules, and to reduce shortening of the lifetime of semiconductor elements.

DESCRIPTION OF EMBODIMENTS

First Embodiment

Figure 1:
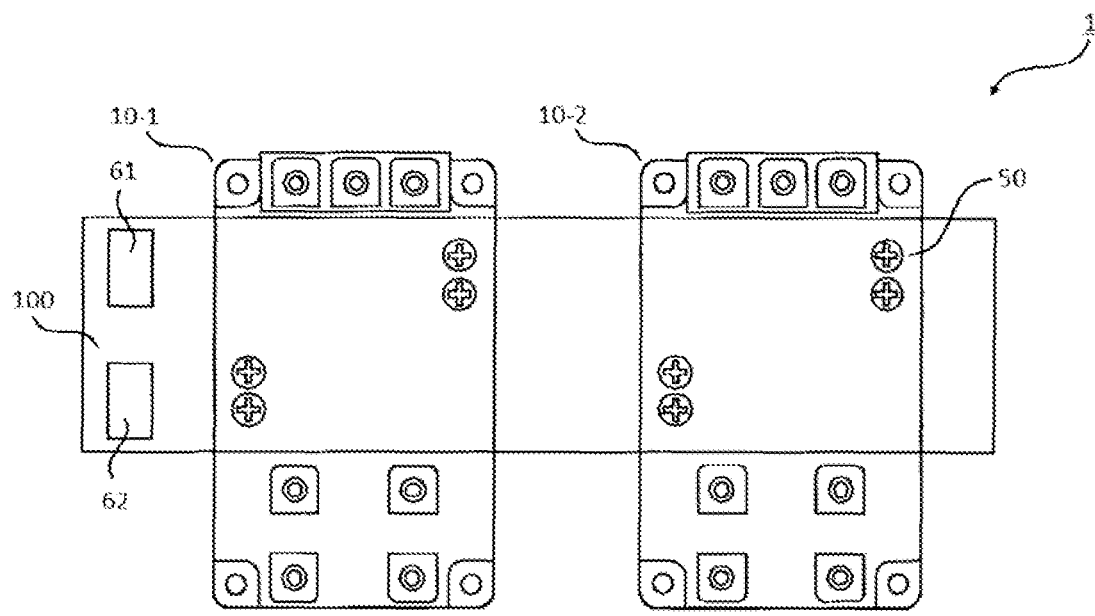
FIG. 1 is a view illustrating a semiconductor module parallel circuit according to a first embodiment.

FIG. 1 is a view illustrating a semiconductor module parallel circuit 1 according to a first embodiment. The semiconductor module parallel circuit 1 includes a semiconductor module 10-1, a semiconductor module 10-2, and a multilayer substrate 100. The multilayer substrate 100 is disposed immediately above the semiconductor module 10-1 and the semiconductor module 10-2, and is physically fixed by a fastening member 50. The semiconductor module 10-1 and the semiconductor module 10-2 are electrically connected in parallel to each other through the multilayer substrate 100. In the following description, the semiconductor modules 10-1 and 10-2 are referred to as semiconductor modules 10 where the semiconductor modules 10-1 and 10-2 need not be distinguished from each other. The semiconductor module 10 is, for example, a power semiconductor module.

When used for a three-phase two-level inverter circuit, the semiconductor module 10-1 and the semiconductor module 10-2 define, for example, a U-phase leg of the three-phase two-level inverter circuit.

Figure 2:
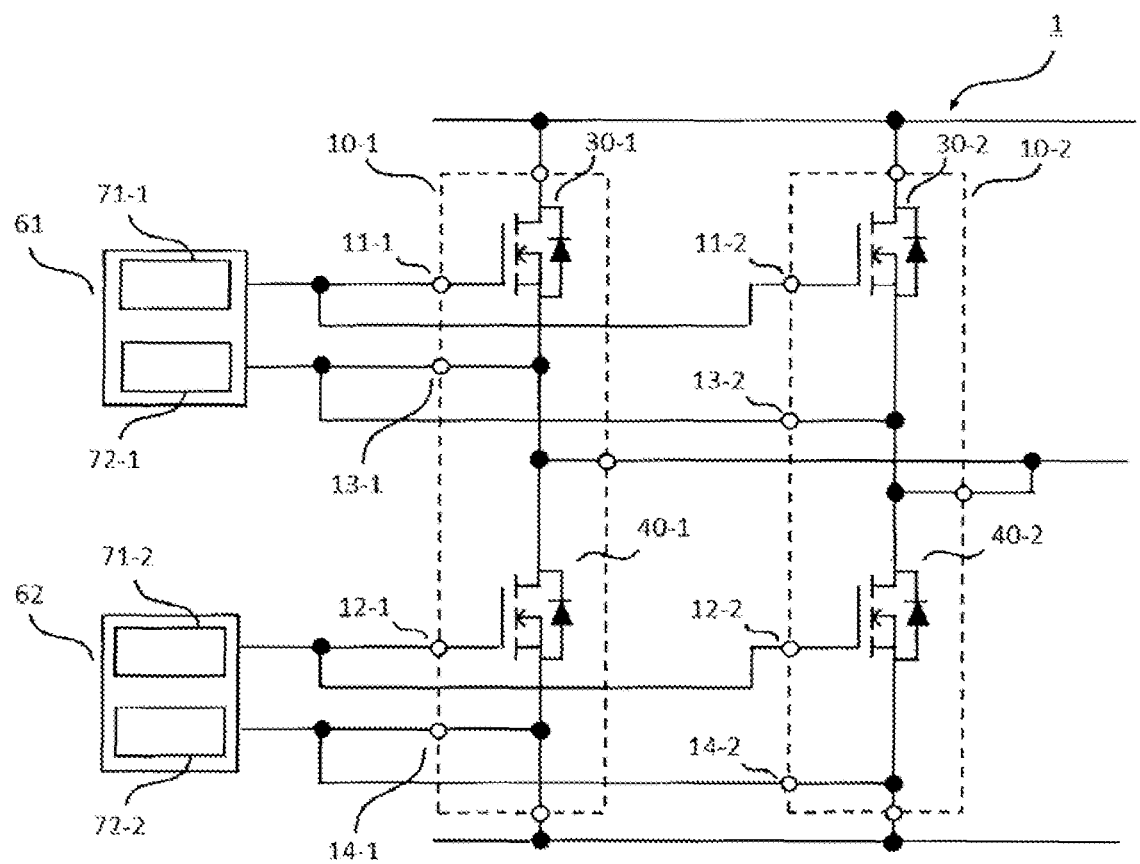
FIG. 2 is a schematic diagram of the semiconductor module parallel circuit according to the first embodiment.

FIG. 2 is a schematic diagram of the semiconductor module parallel circuit according to the first embodiment. The semiconductor module 10-1 and the semiconductor module 10-2 are each enclosed by a broken line.

The semiconductor module 10-1 includes a semiconductor element 30-1 and a semiconductor element 40-1 connected in series with each other, and a source terminal of the semiconductor element 30-1 and a drain terminal of the semiconductor element 40-1 are connected to each other.

The semiconductor module 10-2 includes a semiconductor element 30-2 and a semiconductor element 40-2 connected in series with each other, and a source terminal of the semiconductor element 30-2 and a drain terminal of the semiconductor element 40-2 are connected to each other.

A gate terminal 11-1 of the semiconductor element 30-1 of the semiconductor module 10-1, a gate terminal 11-2 of the semiconductor element 30-2 of the semiconductor module 10-2, and a first connection terminal 71-1 of an external connection terminal 61 of the multilayer substrate are electrically connected to one another. A sense source terminal 13-1 of the semiconductor element 30-1 of the semiconductor module 10-1, a sense source terminal 13-2 of the semiconductor element 30-2 of the semiconductor module 10-2, and a second connection terminal 72-1 of the external connection terminal 61 of the multilayer substrate are electrically connected to one another. The gate terminal 11-1 of the semiconductor element 30-1 of the semiconductor module 10-1 may be referred to as a first signal terminal 11-1, and the gate terminal 11-2 of the semiconductor element 30-2 of the semiconductor module 10-2 may be referred to as a first signal terminal 11-2. The sense source terminal 13-1 of the semiconductor element 30-1 of the semiconductor module 10-1 may be referred to as a second signal terminal 13-1, and the sense source terminal 13-2 of the semiconductor element 30-2 of the semiconductor module 10-2 may be referred to as a second signal terminal 13-2. The first signal terminal 11-1 of the semiconductor element 30-1 of the semiconductor module 10-1 and the first signal terminal 11-2 of the semiconductor element 30-2 of the semiconductor module 10-2 each have a gate potential. The second signal terminal 13-1 of the semiconductor element 30-1 of the semiconductor module 10-1 and the second signal terminal 13-2 of the semiconductor element 30-2 of the semiconductor module 10-2 each have a source potential.

A gate terminal 12-1 of the semiconductor element 40-1 of the semiconductor module 10-1, a gate terminal 12-2 of the semiconductor element 40-2 of the semiconductor module 10-2, and a first connection terminal 71-2 of an external connection terminal 62 of the multilayer substrate are electrically connected to each other. A sense source terminal 14-1 of the semiconductor element 40-1 of the semiconductor module 10-1, a sense source terminal 14-2 of the semiconductor element 40-2 of the semiconductor module 10-2, and a second connection terminal 72-2 of the external connection terminal 62 of the multilayer substrate are electrically connected to each other. The gate terminal 12-1 of the semiconductor element 40-1 of the semiconductor module 10-1 may be referred to as a third signal terminal 12-1, and the gate terminal 12-2 of the semiconductor element 40-2 of the semiconductor module 10-2 may be referred to as a third signal terminal 12-2. The sense source terminal 14-1 of the semiconductor element 40-1 of the semiconductor module 10-1 may be referred to as a fourth signal terminal 14-1, and the sense source terminal 14-2 of the semiconductor element 40-2 of the semiconductor module 10-2 may be referred to as a fourth signal terminal 14-2. The third signal terminal 12-1 of the semiconductor element 40-1 of the semiconductor module 10-1 and the third signal terminal 12-2 of the semiconductor element 40-2 of the semiconductor module 10-2 each have a gate potential. The fourth signal terminal 14-1 of the semiconductor element 40-1 of the semiconductor module 10-1 and the fourth signal terminal 14-2 of the semiconductor element 40-2 of the semiconductor module 10-2 each have a source potential.

A drain terminal of the semiconductor element 30-1 of the semiconductor module 10-1 and a drain terminal of the semiconductor element 30-2 of the semiconductor module 10-2 are connected to each other, and connected to a direct-current bus on a higher potential side (not illustrated).

A source terminal of the semiconductor element 40-1 of the semiconductor module 10-1 and a source terminal of the semiconductor element 40-2 of the semiconductor module 10-2 are connected to each other, and connected to a direct-current bus on a lower potential side (not illustrated).

Figure 3:
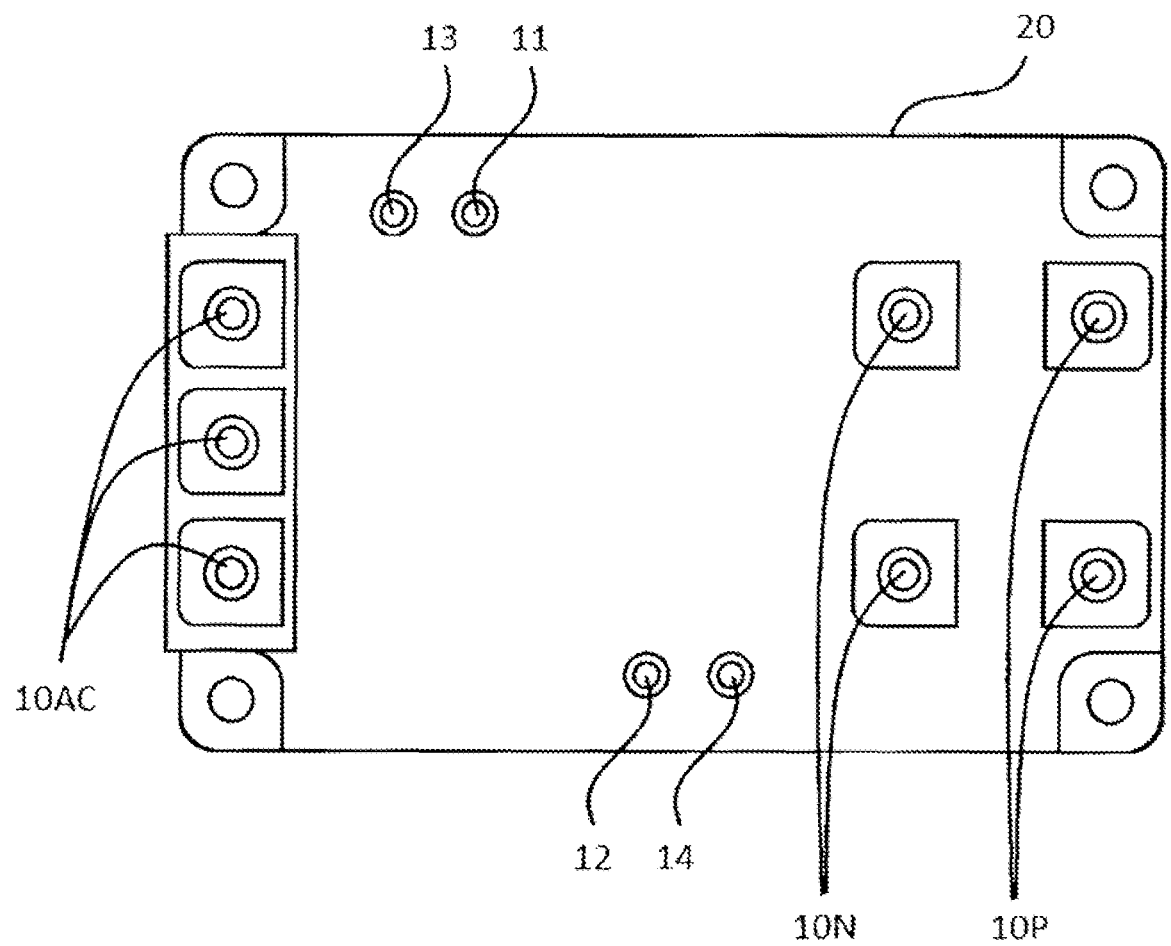
FIG. 3 is a plan view of a package accommodating a semiconductor module according to the first embodiment.

FIG. 3 is a plan view of a package 20 accommodating the semiconductor module 10 according to the first embodiment. Although not illustrated in FIG. 3, the package 20 includes the semiconductor element 30-1 and the semiconductor element 40-1 connected in series with each other. As illustrated in FIG. 3, main terminals 10P, main terminals 10N, and main terminals 10AC are provided on one surface side of the package 20. Two main terminals 10P, which are provided at a longitudinal one end portion of the package 20, are arranged in a direction orthogonal to the longitudinal direction. Two main terminals 10N, which are provided closer to a central portion of the package 20 than the main terminals 10P, are arranged in the direction orthogonal to the longitudinal direction of the package 20. Each of the main terminal 10P and the main terminal 10N is not limited to two in number. Each of the main terminal 10P and the main terminal 10N may be one, or three or more. Three main terminals 10AC, which are provided at the longitudinal other end portion of the package 20, are arranged in the direction orthogonal to the longitudinal direction. The number of main terminals 10AC is not limited to three. The number of main terminals 10AC may be one or two, or four or more.

The main terminals 10P each define a direct-current positive terminal P in the semiconductor module 10, the main terminals 10N each define a direct-current negative terminal N in the semiconductor module 10, and the main terminals 10AC each define an alternating-current terminal AC in the semiconductor module 10.

A first signal terminal 11, a second signal terminal 13, a third signal terminal 12, and a fourth signal terminal 14 are provided between the main terminals 10N and the main terminals 10AC. In other words, the first signal terminal 11, the second signal terminal 13, the third signal terminal 12, and the fourth signal terminal 14 are provided between the direct-current terminals and the alternating-current terminals. The second signal terminal 13 and the first signal terminal 11 are arranged from a side of the main terminal 10AC along one side in the longitudinal direction of the package 20. In addition, the third signal terminal 12 and the fourth signal terminal 14 are provided from the side of the main terminal 10AC along the other side in the longitudinal direction of the package 20.

The first signal terminal 11, the second signal terminal 13, the third signal terminal 12, and the fourth signal terminal 14 are connected to the multilayer substrate 100.

Figure 4:
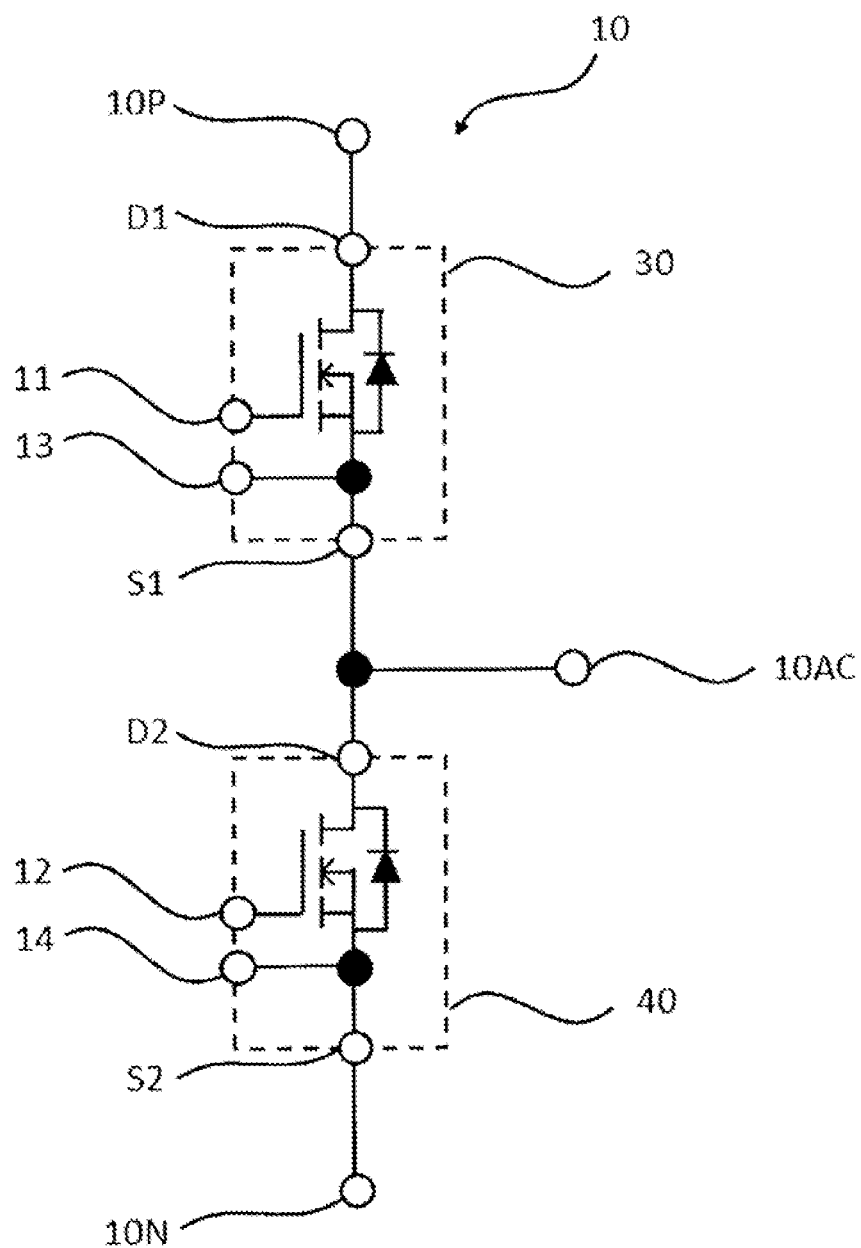
FIG. 4 is a schematic diagram of the semiconductor module according to the first embodiment.

FIG. 4 is a schematic diagram of the semiconductor module 10 according to the first embodiment. The semiconductor module 10 includes a semiconductor element 30 connected to the main terminal 10P and a semiconductor element 40 connected to the main terminal 10N. The semiconductor element 30 and the semiconductor element 40 are connected in series with each other, and an electrical connection point therebetween is connected to the main terminal 10AC.

The semiconductor element 30 includes a drain terminal D1 connected to the main terminal 10P, a source terminal S1 connected to the main terminal 10AC, the first signal terminal 11, and the second signal terminal 13. The drain terminal has a drain potential, the source terminal has a source potential, and the first signal terminal 11 has a gate potential.

The semiconductor element 40 includes a drain terminal D2 connected to the main terminal 10AC, a source terminal S2 connected to the main terminal 10N, the third signal terminal 12, and the fourth signal terminal 14. The drain terminal has a drain potential, the source terminal has a source potential, and the third signal terminal 12 has a gate potential.

In each of the semiconductor element 30 and the semiconductor element 40, a transistor element and a diode element are connected in parallel to each other. Depending on characteristics of a load, for example, in a case of a resistive load, the connection of each diode element may be omitted.

In the first embodiment, a MOSFET is illustrated as the transistor element, but the transistor element is not limited to the MOSFET, and any device, which is switchable between a low resistance state and a high resistance state in accordance with an electric signal, may be employed. For example, a transistor element such as an IGBT or a bipolar transistor may be used. In a case where the transistor element is an IGBT, the "drain terminal" is replaced with a "collector terminal", the "source terminal" is replaced with an "emitter terminal", and the "sense source terminal" is replaced with a "sense emitter terminal". Silicon (Si), silicon carbide (SiC), gallium nitride (GaN), and the like can be used as materials of transistor elements and diode elements that define the semiconductor elements 30 and 40.

Figure 5:
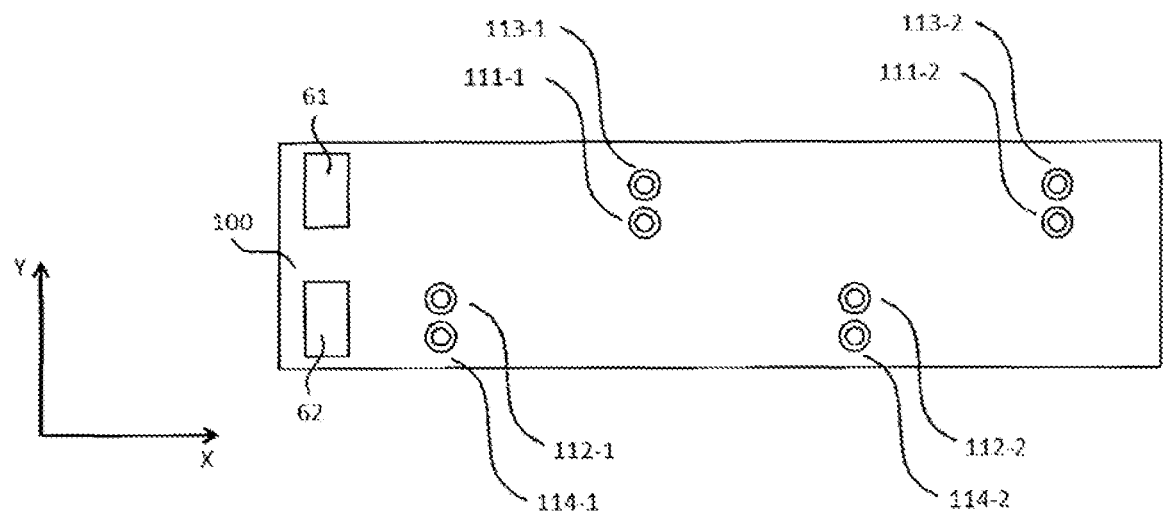
FIG. 5 is a view illustrating a multilayer substrate according to the first embodiment.

FIG. 5 is a plan view of the multilayer substrate 100 used for the semiconductor module parallel circuit 1 according to the first embodiment. In FIG. 5, the multilayer substrate 100 includes a plurality of layers. Illustrated in FIG. 5 is a first layer that is a visible layer, and is referred to as a front surface. A layer that is a visible layer and is located on a side opposite to the front surface is referred to as a back surface. The first layer and a second layer may be invisible layers.

The external connection terminal 61 and the external connection terminal 62 are mounted on the front surface of the multilayer substrate 100. The external connection terminal 61 and the external connection terminal 62 are connected to an external control circuit (not illustrated). The external connection terminals 61 and 62 are mounted on the front surface in FIG. 5, but may be mounted on the back surface. The external connection terminals 61 and 62 may be integrated with each other.

First signal terminal connection patterns 111-1 and 111-2, second signal terminal connection patterns 113-1 and 113-2, third signal terminal connection patterns 112-1 and 112-2, and fourth signal terminal connection patterns 114-1 and 114-2 are formed as patterns. The third signal terminal connection patterns 112-1 and 112-2 and the fourth signal terminal connection patterns 114-1 and 114-2 are not illustrated.

The first signal terminal connection patterns 111-1 and 111-2, the second signal terminal connection patterns 113-1 and 113-2, the third signal terminal connection patterns 112-1 and 112-2, and the fourth signal terminal connection patterns 114-1 and 114-2 are each electrically connected to a back surface pattern through a through hole.

The first signal terminal connection pattern 111-1, the second signal terminal connection pattern 113-1, the third signal terminal connection pattern 112-1, and the fourth signal terminal connection pattern 114-1 are patterns for connection to the first signal terminal 11-1, the second signal terminal 13-1, the third signal terminal 12-1, and the fourth signal terminal 14-1 of the semiconductor module 10-1, respectively.

The first signal terminal connection pattern 111-2, the second signal terminal connection pattern 113-2, the third signal terminal connection pattern 112-2, and the fourth signal terminal connection pattern 114-2 are patterns for connection to the first signal terminal 11-2, the second signal terminal 13-2, the third signal terminal 12-2, and the fourth signal terminal 14-2 of the semiconductor module 10-2, respectively.

Next, a description will be made as to parallel connection of the semiconductor module 10-1 and the semiconductor module 10-2 through the multilayer substrate 100 of the semiconductor module parallel circuit 1 according to the first embodiment.

Figure 6:
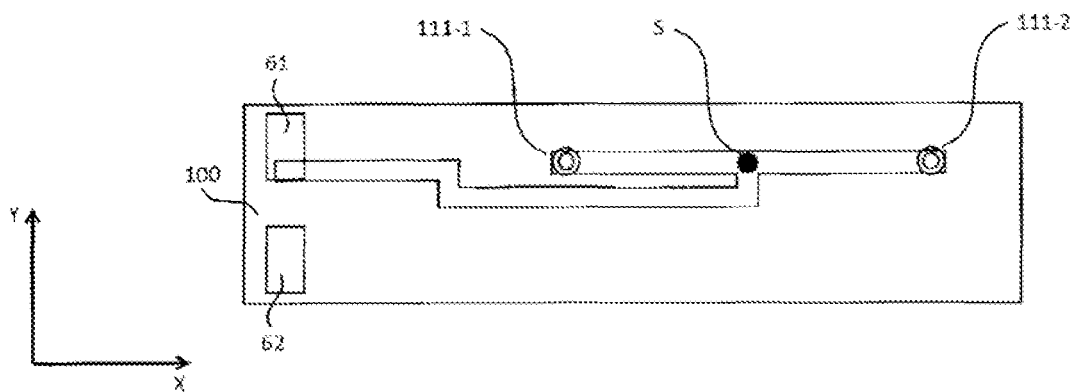
FIG. 6 is a view illustrating a wiring pattern on the multilayer substrate according to the first embodiment.

FIG. 6 is a view illustrating an example in which the first signal terminal connection patterns 111-1 and 111-2 in the multilayer substrate 100 are connected to each other. In FIG. 6, a direction extending from the external connection terminal 61 of the multilayer substrate 100 to each semiconductor module is defined as an X direction, a direction extending from the back surface to the front surface of the multilayer substrate is defined as a Z direction (not illustrated), and a direction orthogonal to the X direction and the Z direction is defined as a Y direction. In FIG. 6, the first signal terminal connection patterns 111-1 and 111-2 and the external connection terminal 61 are wired. The first signal terminal connection patterns 111-1 and 111-2 share common wiring from the external connection terminal 61 to a point S. The wiring branches off from the point S into connection to the first signal terminal connection pattern 111-1 and the first signal terminal connection pattern 111-2. That is, the point S is a branch point. For two semiconductor modules, the point S can be a midpoint of the wiring between the first signal terminal connection patterns 111-1 and 111-2. With the wiring laid as described above, a wiring length from the external connection terminal 61 to the first signal terminal connection pattern 111-1 and a wiring length from the external connection terminal 61 to the first signal terminal connection pattern 111-2 can be equal to each other. In FIG. 6, the wiring from the external connection terminal 61 to the first signal terminal connection patterns is formed in the same layer of the multilayer substrate 100, but may not be formed in the same layer. Different layers of the multilayer substrate 100 may be used. For example, the wiring from the external connection terminal 61 to the point S and the wiring between 111-1 and 111-2 may be in different layers.

Descriptions and illustrations of the third signal terminal connection patterns 112-1 and 112-2 are similar to those of the first signal terminal connection patterns 111-1 and 111-2, and thus will be omitted.

Figure 7:
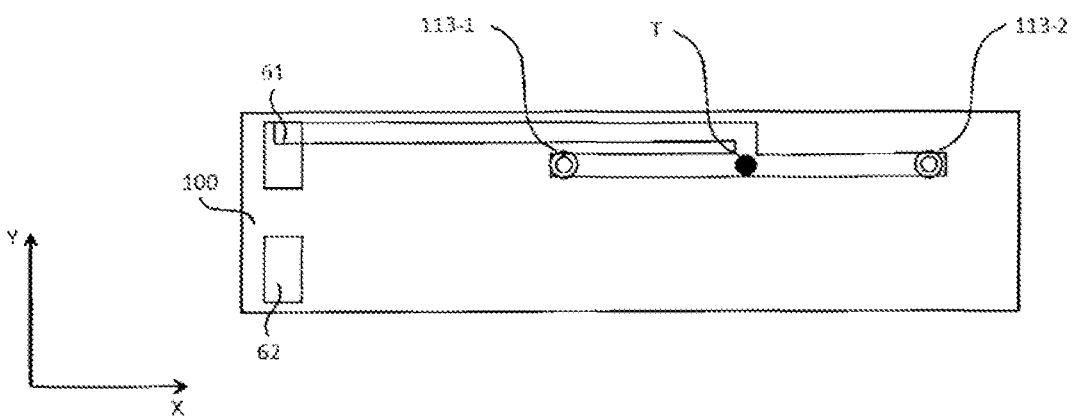
FIG. 7 is a view illustrating a wiring pattern on the multilayer substrate according to the first embodiment.

FIG. 7 is a view illustrating an example in which the second signal terminal connection patterns 113-1 and 113-2 in the multilayer substrate 100 are connected to each other. In FIG. 7, a direction extending from the external connection terminal 61 of the multilayer substrate 100 to each semiconductor module is defined as an X direction, a direction extending from the back surface to the front surface of the multilayer substrate is defined as a Z direction (not illustrated), and a direction orthogonal to the X direction and the Z direction is defined as a Y direction. In FIG. 7, the second signal terminal connection patterns 113-1 and 113-2 and the external connection terminal 61 are wired. The second signal terminal connection patterns 113-1 and 113-2 share common wiring from the external connection terminal 61 to a point T. The wiring branches off from the point T into connection to the second signal terminal connection pattern 113-1 and the second signal terminal connection pattern 113-2. That is, the point T is a branch point. For two semiconductor modules, the point T is a midpoint of the wiring between the second signal terminal connection patterns 113-1 and 113-2. With the wiring laid as described above, a wiring length from the external connection terminal 61 to the second signal terminal connection pattern 113-1 and a wiring length from the external connection terminal 61 to the second signal terminal connection pattern 113-2 can be equal to each other. In FIG. 7, the wiring from the external connection terminal 61 to the second signal terminal connection patterns is formed in the same layer of the multilayer substrate 100, but may not be formed in the same layer. Different layers of the multilayer substrate 100 may be used. For example, the wiring from the external connection terminal 61 to the point T and the wiring between 113-1 and 113-2 may be in different layers.

Descriptions and illustrations of the fourth signal terminal connection patterns 114-1 and 114-2 are similar to those of the second signal terminal connection patterns 113-1 and 113-2, and thus will be omitted.

Wiring, which is a combination of wiring from the external connection terminal 61 to the first signal terminal of the semiconductor module 10-1 and wiring from the second signal terminal of the semiconductor module 10-1 to the external connection terminal 61, is referred to as gate wiring.

The gate wiring for the semiconductor element 30-1 of the semiconductor module 10-1 is a combination of wiring from the external connection terminal 61 to the first signal terminal connection pattern 111-1 and wiring from the second signal terminal connection pattern 113-1 to the external connection terminal 61.

Similarly, wiring, which is a combination of wiring from the external connection terminal 61 to the first signal terminal of the semiconductor module 10-2 and wiring from the second signal terminal of the semiconductor module 10-2 to the external connection terminal 61, is referred to as gate wiring. The gate wiring for the semiconductor element 30-2 of the semiconductor module 10-2 is a combination of wiring from the external connection terminal 61 to the first signal terminal connection pattern 111-2 and wiring from the second signal terminal connection pattern 113-2 to the external connection terminal 61.

With the external connection terminal, the first signal terminal connection patterns, and the second signal terminal connection patterns laid as described above, a length of the gate wiring for the semiconductor element 30-1 of the semiconductor module 10-1 and a length of the gate wiring for the semiconductor element 30-2 of the semiconductor module 10-2 can be the same. Since the length of the gate wiring for the semiconductor element 30-1 of the semiconductor module 10-1 and the length of the gate wiring for the semiconductor element 30-2 of the semiconductor module 10-2 can be equal to each other, it is possible to reduce an imbalance in current between the semiconductor element 30-1 and the semiconductor element 30-2.

A wiring inductance of the gate wiring for the semiconductor element 30-1 of the semiconductor module 10-1 and a wiring inductance of the gate wiring for the semiconductor element 30-2 of the semiconductor module 10-2 can be equal to each other. Since the wiring inductance of the gate wiring for the semiconductor element 30-1 of the semiconductor module 10-1 and the wiring inductance of the gate wiring for the semiconductor element 30-2 of the semiconductor module 10-2 can be equal to each other, it is possible to reduce an imbalance in current between the semiconductor element 30-1 and the semiconductor element 30-2.

Although not described, the gate wiring for the semiconductor element 40-1 of the semiconductor module 10-1 and the gate wiring for the semiconductor element 40-2 of the semiconductor module 10-2 are laid in the same manner as discussed above, such that a wiring inductance of the gate wiring for the semiconductor element 40-1 of the semiconductor module 10-1 and a wiring inductance of the gate wiring for the semiconductor element 40-2 of the semiconductor module 10-2 can be equal to each other. As a result, it is possible to reduce an imbalance in current between the semiconductor element 40-1 and the semiconductor element 40-2.

Inductances of wiring, which are a source of voltage drops, provide the equal amounts of voltage drops caused by the individual wiring inductances if the inductances of wiring are equal to each other, so that flows of current through the wiring can be equal to one another.

In the first embodiment, the lengths of wiring are considered to be equal to each other if an imbalance in current between the semiconductor modules exists to such an extent as to have substantially no influence. Similarly, the inductances of wiring are considered to be equal to each other if an imbalance in current between the semiconductor modules exists to such an extent as to have substantially no influence.

The gate wiring, which is formed in the multilayer substrate 100 as described above to reduce an imbalance in current between the semiconductor modules, can be achieved in a smaller number of layers.

It is preferable for wiring patterns to have substantially the same widths in forming the gate wiring in the multilayer substrate 100 as described above. In the multilayer substrate 100 according to the first embodiment, a distance in the Z direction between the external connection terminal and the first signal terminal connection patterns is preferably short, and a distance in the Z direction between the external connection terminal and the second signal terminal connection patterns is preferably short. That is, the external connection terminal and the first signal terminal connection patterns, and the external connection terminal and the second signal terminal connection patterns, wiring are preferably laid such that wiring patterns overlap when the multilayer substrate 100 is viewed from the positive direction of the Z direction. With the wiring laid as described above, it is possible to achieve a configuration that is less susceptible to noise. The above description is made as to the example in which two semiconductor modules are arranged in parallel, but a similar configuration can be applied even when three or more semiconductor modules are arranged in parallel. In the above description, the wiring lengths from the branch point (point S) to the first signal terminal connection patterns of the two semiconductor modules are equal to each other, and the wiring lengths from the branch point (point T) to the second signal terminal connection patterns of the two semiconductor modules are equal to each other. In a case of three semiconductor modules, similarly, the wiring lengths from the branch point to the first signal terminal connection patterns of the three semiconductor modules are equal to one another, and the wiring lengths from the branch point to the second signal terminal connection patterns of the three semiconductor modules are equal to one another. As a result, the individual gate wiring lengths for the three semiconductor modules can be identical to one another. Since the individual gate wiring lengths for the three semiconductor modules are equal to one another, it is possible to reduce an imbalance in current among the three semiconductor elements. The above description is made as to the example in which the branch points are used for the wiring from the external connection terminal to the first signal terminal connection patterns of the semiconductor modules and the wiring from the external connection terminal to the second signal terminal connection patterns of the semiconductor modules, but there is no limitation thereto. The wiring from the external connection terminal to the first signal terminal connection patterns of the semiconductor modules and the wiring from the external connection terminal to the second signal terminal connection patterns of the semiconductor modules may be configured without using the branch points. Even in that case, the individual gate wiring lengths are equal to one another, thereby making it possible to reduce an imbalance in current among the three semiconductor elements.

The semiconductor module parallel circuit according to the first embodiment includes: a first power semiconductor module; a second power semiconductor module; and a multilayer substrate that interconnects a plurality of the power semiconductor modules, each of the power semiconductor modules includes: a power semiconductor switching element; a first signal terminal connected to a gate potential of the power semiconductor switching element; and a second signal terminal connected to a source potential of the power semiconductor switching element, the multilayer substrate includes: an external connection terminal; a first signal terminal connection pattern for the first power semiconductor module, the first signal terminal connection pattern for the first power semiconductor module being connected to the first signal terminal of the first power semiconductor module; a second signal terminal connection pattern for the first power semiconductor module, the second signal terminal connection pattern for the first power semiconductor module being connected to the second signal terminal of the first power semiconductor module; a first signal terminal connection pattern for the second power semiconductor module, the first signal terminal connection pattern for the second power semiconductor module being connected to the first signal terminal of the second power semiconductor module; and a second signal terminal connection pattern for the second power semiconductor module, the second signal terminal connection pattern for the second power semiconductor module being connected to the second signal terminal of the second power semiconductor module, and an inductance of gate wiring for the first power semiconductor module from the external connection terminal to the first signal terminal connection pattern for the first power semiconductor module and from the second signal terminal connection pattern for the first power semiconductor module to the external connection terminal, and an inductance of gate wiring for the second power semiconductor module from the external connection terminal to the first signal terminal connection pattern for the second power semiconductor module and from the second signal terminal connection pattern for the second power semiconductor module to the external connection terminal are equal to each other, whereby it is possible to reduce an imbalance in current between the semiconductor modules.

The semiconductor module parallel circuit according to the first embodiment includes: a first power semiconductor module; a second power semiconductor module; and a multilayer substrate that interconnects a plurality of the power semiconductor modules, each of the power semiconductor modules includes: a power semiconductor switching element; a first signal terminal connected to a gate potential of the power semiconductor switching element; and a second signal terminal connected to a source potential of the power semiconductor switching element, the multilayer substrate includes: an external connection terminal; a first signal terminal connection pattern for the first power semiconductor module, the first signal terminal connection pattern for the first power semiconductor module being connected to the first signal terminal of the first power semiconductor module; a second signal terminal connection pattern for the first power semiconductor module, the second signal terminal connection pattern for the first power semiconductor module being connected to the second signal terminal of the first power semiconductor module; a first signal terminal connection pattern for the second power semiconductor module, the first signal terminal connection pattern for the second power semiconductor module being connected to the first signal terminal of the second power semiconductor module; and a second signal terminal connection pattern for the second power semiconductor module, the second signal terminal connection pattern for the second power semiconductor module being connected to the second signal terminal of the second power semiconductor module, and a length of gate wiring for the first power semiconductor module from the external connection terminal to the first signal terminal connection pattern for the first power semiconductor module and from the second signal terminal connection pattern for the first power semiconductor module to the external connection terminal, and a length of gate wiring for the second power semiconductor module from the external connection terminal to the first signal terminal connection pattern for the second power semiconductor module and from the second signal terminal connection pattern for the second power semiconductor module to the external connection terminal are equal to each other, whereby it is possible to reduce an imbalance in current between the semiconductor modules, and to reduce shortening of the lifetime of semiconductor elements.

In the semiconductor module parallel circuit according to the first embodiment, the gate wiring length for the first power semiconductor module from the external connection terminal to the first signal terminal connection pattern for the first power semiconductor module and from the second signal terminal connection pattern for the first power semiconductor module to the external connection terminal, and the gate wiring length for the second power semiconductor module from the external connection terminal to the first signal terminal connection pattern for the second power semiconductor module and from the second signal terminal connection pattern for the second power semiconductor module to the external connection terminal are equal to each other, whereby it is possible to reduce the imbalance in current between the semiconductor modules.

In the semiconductor module parallel circuit according to the first embodiment, the wiring from the external connection terminal to the first signal terminal connection pattern for the first power semiconductor module and the wiring from the external connection terminal to the first signal terminal connection pattern for the second power semiconductor module are formed in a first layer of the multilayer substrate, and the wiring from the second signal terminal connection pattern for the first power semiconductor module to the external connection terminal and the wiring from the second signal terminal connection pattern for the second power semiconductor module to the external connection terminal are formed in a second layer of the multilayer substrate, whereby it is possible to reduce an imbalance in current between the semiconductor modules.

The semiconductor module connection substrate according to the first embodiment includes: an external connection terminal; a first signal terminal connection pattern for a first power semiconductor module, the first signal terminal connection pattern for the first power semiconductor module being provided for connection to a first signal terminal of the first power semiconductor module; a second signal terminal connection pattern for the first power semiconductor module, the second signal terminal connection pattern for the first power semiconductor module being provided for connection to a second signal terminal of the first power semiconductor module; a first signal terminal connection pattern for a second power semiconductor module, the first signal terminal connection pattern for the second power semiconductor module being provided for connection to a first signal terminal of the second power semiconductor module; and a second signal terminal connection pattern for the second power semiconductor module, the second signal terminal connection pattern for the second power semiconductor module being provided for connection to a second signal terminal of the second power semiconductor module, and an inductance of gate wiring for the first power semiconductor module from the external connection terminal to the first signal terminal connection pattern for the first power semiconductor module and from the second signal terminal connection pattern for the first power semiconductor module to the external connection terminal, and an inductance of gate wiring for the second power semiconductor module from the external connection terminal to the first signal terminal connection pattern for the second power semiconductor module and from the second signal terminal connection pattern for the second power semiconductor module to the external connection terminal are equal to each other, whereby it is possible to reduce an imbalance in current between the semiconductor modules.

Second Embodiment

Parallel connection of the semiconductor module 10-1 and the semiconductor module 10-2 through a multilayer substrate 200 of a semiconductor module parallel circuit 2 in a second embodiment will be described.

Figure 8:
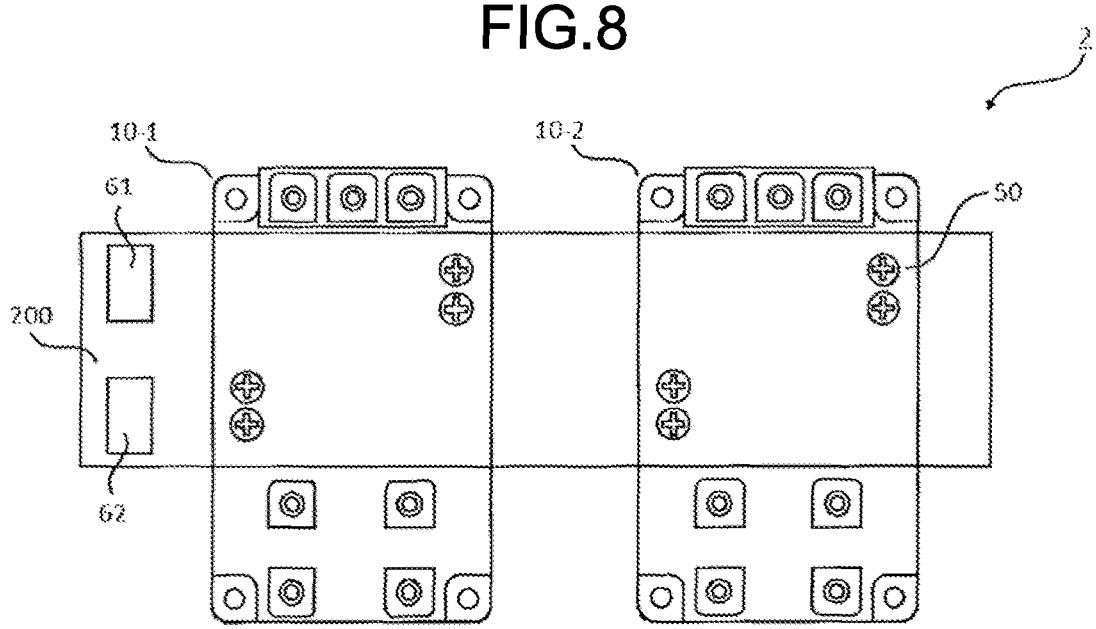
FIG. 8 is a view illustrating a semiconductor module parallel circuit in a second embodiment.
Figure 9:
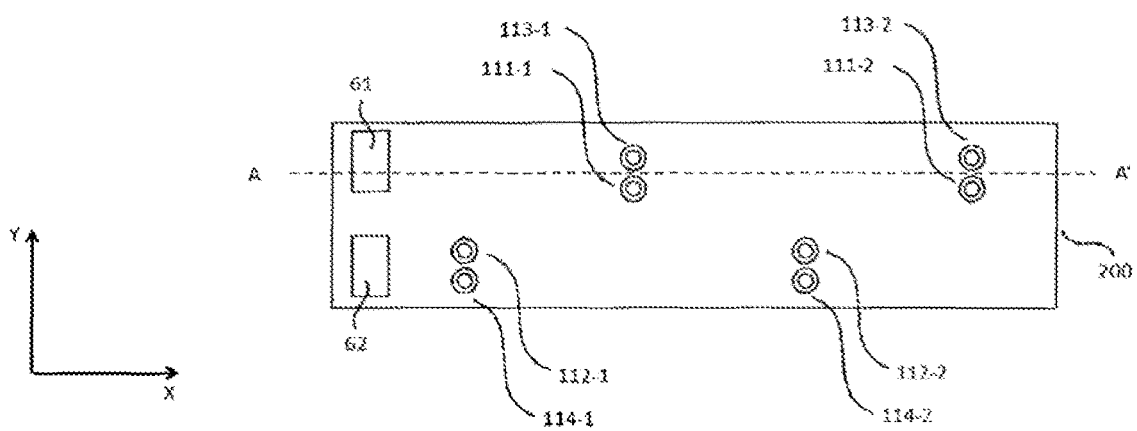
FIG. 9 is a view illustrating a multilayer substrate according to the second embodiment.
Figure 10:
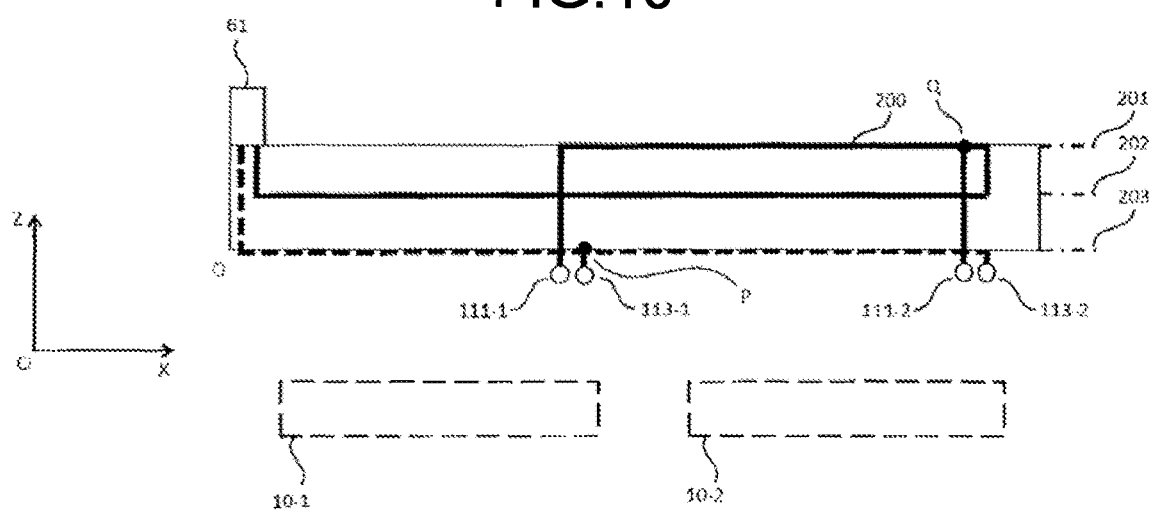
FIG. 10 is a schematic view of the semiconductor module parallel circuit according to the second embodiment.

FIG. 8 is a view illustrating a configuration of the semiconductor module parallel circuit 2 in which two semiconductor modules are disposed in parallel to each other. FIG. 9 is a view illustrating the multilayer substrate 200 of the semiconductor module parallel circuit 2 in the second embodiment. FIG. 10 is a schematic view of a cross section of the multilayer substrate 200 of FIG. 9 taken along line A-A'. In FIG. 10, a direction extending from the external connection terminal 61 of the multilayer substrate 200 to each semiconductor module is defined as an X direction, a direction extending from a back surface to a front surface of the multilayer substrate is defined as a Z direction, and a direction orthogonal to the X direction and the Z direction is defined as a Y direction (not illustrated). The multilayer substrate 200 is formed of three layers: a first layer 201; a second layer 202; and a third layer 203. In the X direction, a coordinate position of the external connection terminal 61 is set to 0. In the Z direction, a coordinate position of the third layer 203 of the multilayer substrate 200 in contact with the semiconductor modules 10-1 and 10-2 is set to 0. The first layer is defined as a front surface, and the third layer is defined as a back surface. The first layer and the third layer may be invisible layers. The semiconductor module 10-1 and the semiconductor module 10-2 are disposed in parallel to each other in the X direction, and the semiconductor module 10-1 and the semiconductor module 10-2 are arranged in this order from a side closer to the external connection terminal 61.

In FIG. 10, a solid line indicates wiring from the external connection terminal 61 to the first signal terminal connection pattern, and a broken line indicates wiring from the second signal terminal connection pattern to the external connection terminal 61. The first signal terminal connection patterns 111-1 and 111-2 and the second signal terminal connection patterns 113-1 and 113-2 are formed in the third layer 203 of the multilayer substrate 200 for the purpose of connection to individual signal terminals for the individual semiconductor modules.

Wiring formed in the first layer 201 of the multilayer substrate 200 is referred to as gate return wiring, wiring formed in the second layer 202 is referred to as gate forward wiring, and wiring formed in the third layer 203 is referred to as output wiring. The gate forward wiring is connected to the external connection terminal 61. The gate forward wiring is connected to the gate return wiring. The gate return wiring is connected to the first signal terminal connection patterns 111-1 and 111-2. Wiring from the gate return wiring to the first signal terminal connection pattern 111-1 is not connected to the gate forward wiring. Similarly, wiring from the gate return wiring to the first signal terminal connection pattern 111-2 is not connected to the gate forward wiring. A position in the X direction where the gate return wiring and the first signal terminal connection pattern 111-2 are connected to each other is closer to the external connection terminal 61 with respect to the X direction than a position in the X direction where the gate forward wiring and the gate return wiring are connected to each other. In other words, the gate forward wiring formed in the second layer 202 is connected to the gate return wiring formed in the first layer 201, and the gate return wiring is connected to the first signal terminal connection pattern 111-2 at the position offset in a direction opposite to the X direction from the position where the gate forward wiring formed in the second layer 202 is connected to the gate return wiring formed in the first layer 201.

The position in the X direction where the gate return wiring and the first signal terminal connection pattern 111-2 are connected to each other is referred to as a branch point Q.

The second signal terminal connection patterns 113-1 and 113-2 are connected to the output wiring. A position in the X direction where the second signal terminal connection pattern 113-1 is connected to the output wiring is closer to the external connection terminal 61 with respect to the X direction than a position in the X direction where the second signal terminal connection pattern 113-2 is connected to the output wiring. The output wiring is connected to the external connection terminal 61.

The position in the X direction where the second signal terminal connection pattern 113-1 is connected to the output wiring is referred to as a junction P.

When a wiring length from the external connection terminal 61 to the first signal terminal connection pattern 111-1 is denoted by Len1g and a wiring length from the second signal terminal connection pattern 113-1 to the external connection terminal 61 is denoted by Len1s, a wiring length Len1 of gate wiring for the semiconductor module 10-1 is Len1g+Len1s. Similarly, when a wiring length from the external connection terminal 61 to the first signal terminal connection pattern 111-2 is denoted by Len2g and a wiring length from the second signal terminal connection pattern 113-2 to the external connection terminal 61 is denoted by Len2s, a wiring length Len2 of gate wiring of the semiconductor module 10-2 is Len2g+Len2s. In the second embodiment, the gate wiring is formed such that the gate wiring length (wiring length Len1) for the first power semiconductor module from the external connection terminal 61 to the first signal terminal connection pattern for the first power semiconductor module and from the second signal terminal connection pattern for the first power semiconductor module to the external connection terminal, and the gate wiring length (wiring length Len2) for the second power semiconductor module from the external connection terminal to the first signal terminal connection pattern for the second power semiconductor module and from the second signal terminal connection pattern for the second power semiconductor module to the external connection terminal are equal to each other (Len1=Len2). That is, the gate wiring is formed such that a wiring inductance generated in the gate wiring for the semiconductor module 10-1 and a wiring inductance generated in the gate wiring for the semiconductor module 10-2 are equal to each other. Note that, for example, the first power semiconductor module is the semiconductor module 10-1, and the second power semiconductor module is the semiconductor module 10-2.

In FIG. 10, Len1g is a wiring length of wiring from the external connection terminal 61 to the first signal terminal connection pattern 111-1. Len1s is a wiring length of a combination of wiring from the second signal terminal connection pattern 113-1 to the junction P and wiring from the junction P to the external connection terminal 61. Len2g is a wiring length of a combination of wiring from the external connection terminal 61 to the branch point Q and wiring from the branch point Q to the first signal terminal connection pattern 111-2. Len2s is a wiring length of wiring from the second signal terminal connection pattern 113-2 to the external connection terminal 61.

In the second embodiment, the wiring is formed as described above, such that the wiring length of the gate wiring for the semiconductor module 10-1 and the wiring length of the gate wiring for the semiconductor module 10-2 can be equal to each other. That is, the gate wiring is formed such that Len1=Len2 holds true. The wiring inductance generated in the gate wiring for the semiconductor module 10-1 and the wiring inductance generated in the gate wiring for the semiconductor module 10-2 can be equal to each other.

Next, a gate drive current in the semiconductor module parallel circuit 2 will be described. A current input from the external connection terminal 61 flows through the gate forward wiring formed in the second layer 202 of the multilayer substrate 200 and then through the gate return wiring formed in the first layer 201 of the multilayer substrate 200. Next, the current branches at the branch point Q of the gate return wiring to provide flows of current into the first signal terminal connection pattern 111-1 and the first signal terminal connection pattern 111-2.

One of the branched gate drive currents flows to the first signal terminal 11-1 of the semiconductor module 10-1 via the first signal terminal connection pattern 111-1, and similarly, the other flows to the first signal terminal 11-2 of the semiconductor module 10-2 via the first signal terminal connection pattern 111-2.

Next, a current output from the second signal terminal 13-1 of the semiconductor module 10-1 flows into the output wiring of the multilayer substrate 200 via the second signal terminal connection pattern 113-1. Similarly, a current output from the second signal terminal 13-2 of the semiconductor module 10-2 flows into the output wiring of the multilayer substrate 200 via the second signal terminal connection pattern 113-2. The current output from the second signal terminal connection pattern 113-2 merges with the current output from the second signal terminal connection pattern 113-1 at the junction P on the output wiring. The merged current is output from the external connection terminal 61.

Figure 11:
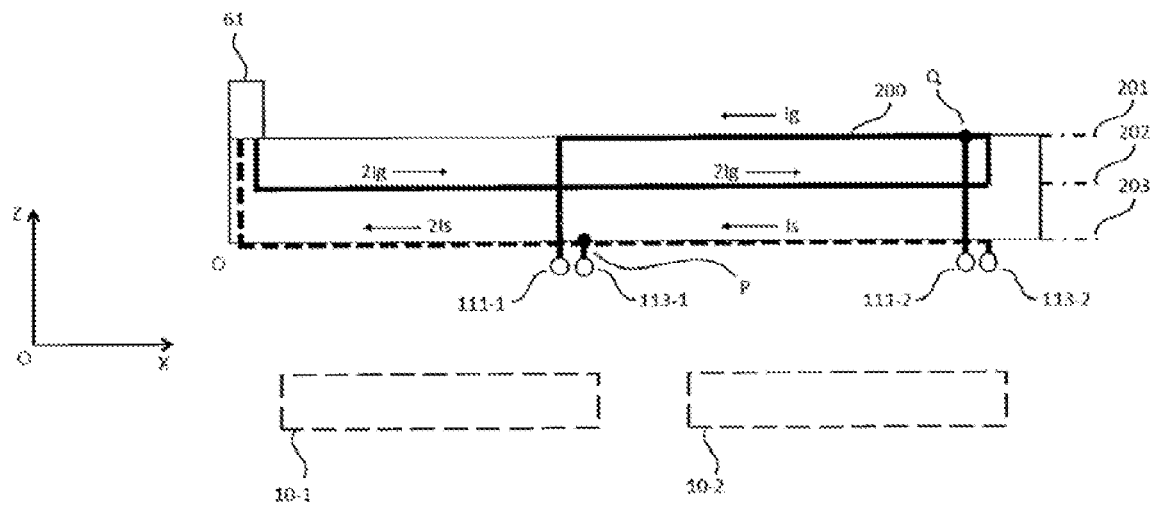
FIG. 11 is a view illustrating a gate drive current in the semiconductor module parallel circuit according to the second embodiment.

FIG. 11 is a view illustrating a gate drive current flowing through each layer of the multilayer substrate 200. When a current flowing through the gate forward wiring is denoted by $Ig_{12}$, a current flowing from the branch point Q to the first signal terminal connection pattern 111-1 is denoted by $I1g$, and a current flowing from the branch point Q to the first signal terminal connection pattern 111-2 is denoted by $I2g$, formula (1) below holds true.

$$Ig_{12} = I1g + I2g \quad (1)$$

Currents input to the first signal terminals of the semiconductor modules 10-1 and 10-2 can be approximated as in formula (2) below.

$$I1g = I2g = Ig \quad (2)$$

Formula (3) below is derived from formulas (1) and (2).

$$Ig_{12} = 2Ig \quad (3)$$

From formulas (2) and (3), the currents $I1g$ and $I2g$ branched at the branch point Q and flowing therefrom through the gate return wiring are each ½ of the current $Ig_{12}$ flowing through the gate forward wiring. In other words, the current $Ig_{12}$ flowing through the gate forward wiring is a current (2Ig) that is twice the current Ig ($I1g$, $I2g$) branched at the branch point Q and flowing therefrom.

Next, when a current flowing through the output wiring is denoted by $Is_{12}$, a current flowing from the second signal terminal connection pattern 113-2 is denoted by $I2s$, and a current flowing from the second signal terminal connection pattern 113-1 is denoted by $I1s$, formula (4) below holds true.

$$I1s + I2s = Is_{12} \quad (4)$$

Currents output from the second signal terminals of the semiconductor modules 10-1 and 10-2 can be approximated as in formula (5).

$$I1s = I2s = Is \quad (5)$$

Formula (6) below is derived from formulas (4) and (5).

$$Is_{12} = 2Is \quad (6)$$

From formulas (5) and (6), the currents $I1s$ and $I2s$ flowing through the output wiring before merging at the junction P are each ½ of the current $Is_{12}$ flowing through the output wiring. In other words, the current $Is_{12}$ flowing through the output wiring is a current (2Is) that is twice the current Is ($I1s$, $I2s$) flowing before the merging at the junction P.

The current (Ig) flowing from the branch point Q to the first signal terminal of the semiconductor module 10-1 and the current (Is) flowing from the second signal terminal of the semiconductor module 10-2 to the junction P can be equal to each other. That is, a voltage drop amount in wiring extending from the branch point Q to the first signal terminal of the semiconductor module 10-1 and a voltage drop amount in wiring extending from the second signal terminal of the semiconductor module 10-2 to the junction P can be equal to each other.

In the second embodiment, a current, which is the sum of the gate currents flowing through the first signal terminals of the semiconductor modules 10-1 and 10-2, flows through the gate forward wiring formed in the multilayer substrate 200, such that wiring inductances of the gate wiring for the semiconductor module 10-1 and the gate wiring for the semiconductor module 10-2 can be equal to each other.

Since the wiring inductance of the gate wiring for the semiconductor module 10-1 and the wiring inductance of the gate wiring for the semiconductor module 10-2 can be equal to each other, it is possible to reduce an imbalance in current generated between the semiconductor modules when the semiconductor modules are driven in parallel.

It is preferable to adjust wiring patterns to have substantially the same widths in forming the gate wiring in the multilayer substrate 200.

In the second embodiment, the wiring to the first signal terminals of the semiconductor modules is formed in the two layers of the multilayer substrate 200, such that the gate wiring lengths for the semiconductor modules can be equal to each other.

In the second embodiment, the lengths of wiring are considered to be equal to each other if an imbalance in current between the semiconductor modules exists to such an extent as to have substantially no influence. Similarly, the inductances of wiring are considered to be equal to each other if an imbalance in current between the semiconductor modules exists to such an extent as to have substantially no influence.

Although not described, the gate wiring for the semiconductor element 40-1 of the semiconductor module 10-1 and the gate wiring for the semiconductor element 40-2 of the semiconductor module 10-2 are laid in the same manner as discussed above, such that a wiring inductance of the gate wiring for the semiconductor element 40-1 of the semiconductor module 10-1 and a wiring inductance of the gate wiring for the semiconductor element 40-2 of the semiconductor module 10-2 can be equal to each other. As a result, it is possible to reduce an imbalance in current between the semiconductor element 40-1 and the semiconductor element 40-2.

In the second embodiment, the gate return wiring is formed in the first layer 201 of the multilayer substrate 200, and the output wiring is formed in the third layer 203 of the multilayer substrate 200. Alternatively, the output wiring may be formed in the first layer 201 of the multilayer substrate 200, and the gate return wiring may be formed in the third layer 203 of the multilayer substrate 200.

In the semiconductor module parallel circuit according to the second embodiment, the wiring from the external connection terminal to the first signal terminal connection pattern for the first power semiconductor module and the wiring from the external connection terminal to the first signal terminal connection pattern for the second power semiconductor module are formed in the first layer 201 and the third layer 203 of the multilayer substrate, whereby it is possible to reduce an imbalance in current between the semiconductor modules.

Third Embodiment

Figure 12:
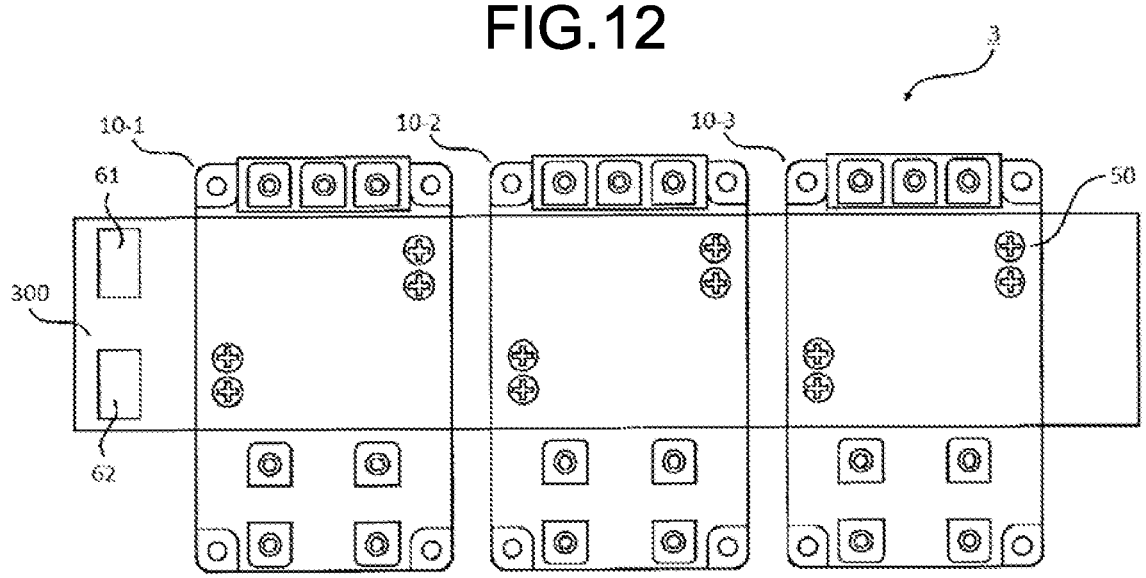
FIG. 12 is a view illustrating a semiconductor module parallel circuit in a third embodiment.

The first and second embodiments described above give an example in which two semiconductor modules are disposed in parallel to each other. A third embodiment described below gives an example in which three semiconductor modules are disposed in parallel to one another. FIG. 12 is a view illustrating a configuration of a semiconductor module parallel circuit 3 in which three semiconductor modules are disposed in parallel to one another. The semiconductor modules 10-1 and 10-2, and a semiconductor module 10-3 are arranged in parallel. The third embodiment differs from the first and second embodiments in that the semiconductor module 10-3 is added. The semiconductor modules 10-1, 10-2, and 10-3 are connected to a multilayer substrate 300 and driven in parallel.

Figure 13:
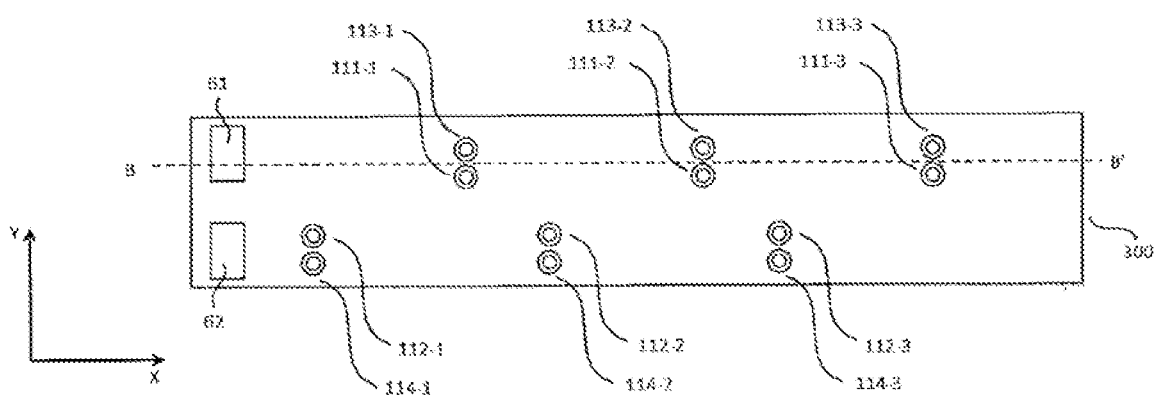
FIG. 13 is a view illustrating a multilayer substrate according to the third embodiment.

FIG. 13 is a view illustrating the multilayer substrate 300 of the semiconductor module parallel circuit 3 in the third embodiment. In FIG. 13, the multilayer substrate 300 differs from the multilayer substrates in the first and second embodiments in that a first signal terminal connection pattern 111-3, a second signal terminal connection pattern 113-3, a third signal terminal connection pattern 112-3, and a fourth signal terminal connection pattern 114-3 connected to the semiconductor module 10-3 are formed.

The first signal terminal connection pattern 111-3, the second signal terminal connection pattern 113-3, the third signal terminal connection pattern 112-3, and the fourth signal terminal connection pattern 114-3 are patterns for connection to the first signal terminal 11-1, the second signal terminal 13-1, the third signal terminal 12-1, and the fourth signal terminal 14-1 of the semiconductor module 10-3, respectively.

Figure 14:
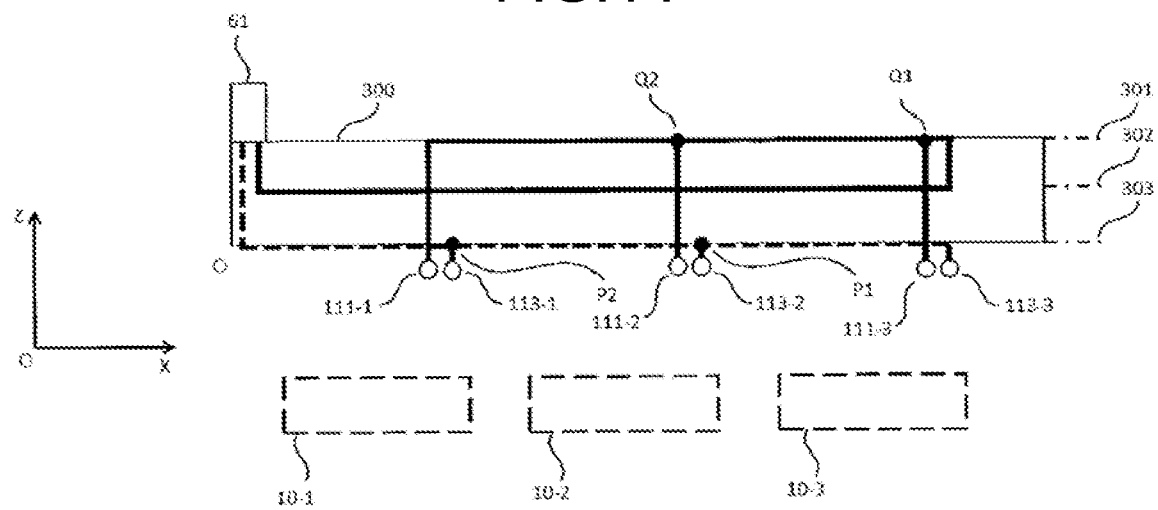
FIG. 14 is a schematic view of the semiconductor module parallel circuit according to the third embodiment.

FIG. 14 is a schematic view of a cross section of the multilayer substrate 300 of FIG. 13 taken along line B-B'. In FIG. 14, a direction extending from the external connection terminal 61 of the multilayer substrate 300 to each semiconductor module is defined as an X direction, a direction extending from a back surface to a front surface of the multilayer substrate 300 is defined as a Z direction, and a direction orthogonal to the X direction and the Z direction is defined as a Y direction (not illustrated). The multilayer substrate 300 is formed of three layers: a first layer 301; a second layer 302; and a third layer 303. An interlayer distance between the first layer 301 and the second layer 302 and an interlayer distance between the second layer 302 and the third layer 303 are formed to be equal to each other. In the X direction, a coordinate position of the external connection terminal 61 is set to 0. In the Z direction, a coordinate position of the third layer 303 of the multilayer substrate 300 is set to 0. The first layer is defined as a front surface, and the third layer is defined as a back surface. The first layer and the third layer may be invisible layers. The semiconductor modules 10-1, 10-2, and 10-3 are disposed in parallel to one another in the X direction, and the semiconductor module 10-1, the semiconductor module 10-2, and the semiconductor module 103 are arranged in this order from a side closer to the external connection terminal 61.

In FIG. 14, a solid line indicates wiring from the external connection terminal 61 to the first signal terminal connection pattern, and a broken line indicates wiring from the second signal terminal connection pattern to the external connection terminal 61. The first signal terminal connection patterns 111-1, 111-2, and 111-3 and the second signal terminal connection patterns 113-1, 113-2, and 113-3 are formed in the third layer 303 of the multilayer substrate 300 for the purpose of connection to individual signal terminals for the individual semiconductor modules.

Wiring formed in the first layer 301 of the multilayer substrate 300 is referred to as gate return wiring, wiring formed in the second layer 302 is referred to as gate forward wiring, and wiring formed in the third layer 303 is referred to as output wiring. The gate forward wiring is connected to the external connection terminal 61. The gate forward wiring is connected to the gate return wiring. The gate return wiring is connected to the first signal terminal connection patterns 111-1, 111-2, and 111-3. Wiring from the gate return wiring to the first signal terminal connection pattern 111-1 is not connected to the gate forward wiring. Similarly, wiring from the gate return wiring to the first signal terminal connection pattern 111-2 and wiring from the gate return wiring to the first signal terminal connection pattern 111-3 are not connected to the gate forward wiring. A position in the X direction where the gate return wiring and the first signal terminal connection pattern 111-3 are connected to each other is closer to the external connection terminal 61 with respect to the X direction than a position in the X direction where the gate forward wiring and the gate return wiring are connected to each other. In other words, the gate forward wiring formed in the second layer 302 is connected to the gate return wiring formed in the first layer 301, and the gate return wiring is connected to the first signal terminal connection pattern 111-3 at the position offset in a direction opposite to the X direction from the position where the gate forward wiring formed in the second layer 302 is connected to the gate return wiring formed in the first layer 301. A position in the X direction where the gate return wiring and the first signal terminal connection pattern 111-2 are connected to each other is closer to the external connection terminal 61 with respect to the X direction than the position in the X direction where the gate return wiring and the first signal terminal connection pattern 111-3 are connected to each other.

The position in the X direction where the gate return wiring and the first signal terminal connection pattern 111-3 are connected to each other is referred to as a branch point Q1. The position in the X direction where the gate return wiring and the first signal terminal connection pattern 111-2 are connected to each other is referred to as a branch point Q2.

The second signal terminal connection patterns 113-1, 113-2, and 113-3 are connected to the output wiring. A position in the X direction where the second signal terminal connection pattern 113-2 is connected to the output wiring is closer to the external connection terminal 61 with respect to the X direction than a position in the X direction where the second signal terminal connection pattern 113-3 is connected to the output wiring. A position in the X direction where the second signal terminal connection pattern 113-1 is connected to the output wiring is closer to the external connection terminal 61 with respect to the X direction than a position in the X direction where the second signal terminal connection pattern 113-2 is connected to the output wiring. The output wiring is connected to the external connection terminal 61.

The position in the X direction where the second signal terminal connection pattern 113-2 is connected to the output wiring is referred to as a junction P1, and the position in the X direction where the second signal terminal connection pattern 113-1 is connected to the output wiring is referred to as a junction P2.

When a wiring length from the external connection terminal 61 to the first signal terminal connection pattern 111-1 is denoted by Len1$g$ and a wiring length from the second signal terminal connection pattern 113-1 to the external connection terminal 61 is denoted by Len1$s$, a wiring length Len1 of gate wiring for the semiconductor module 10-1 is Len1$g$+Len1$s$. Similarly, when a wiring length from the external connection terminal 61 to the first signal terminal connection pattern 111-2 is denoted by Len2$g$ and a wiring length from the second signal terminal connection pattern 113-2 to the external connection terminal 61 is denoted by Len2$s$, a wiring length Len2 of gate wiring for the semiconductor module 10-2 is Len2$g$+Len2$s$. Similarly, when a wiring length from the external connection terminal 61 to the first signal terminal connection pattern 111-3 is denoted by Len3$g$ and a wiring length from the second signal terminal connection pattern 113-3 to the external connection terminal 61 is denoted by Len3$s$, a wiring length Len3 of gate wiring for the semiconductor module 10-3 is Len3$g$+Len3$s$.

In the third embodiment, the gate wiring is formed such that the gate wiring length (wiring length Len1) for the first power semiconductor module from the external connection terminal 61 to the first signal terminal connection pattern for the first power semiconductor module and from the second signal terminal connection pattern for the first power semiconductor module to the external connection terminal 61, the gate wiring length (wiring length Len2) for the second power semiconductor module from the external connection terminal 61 to the first signal terminal connection pattern for the second power semiconductor module and from the second signal terminal connection pattern for the second power semiconductor module to the external connection terminal 61, and the gate wiring length (wiring length Len3) for a third power semiconductor module from the external connection terminal 61 to the first signal terminal connection pattern for the third power semiconductor module and from the second signal terminal connection pattern for the third power semiconductor module to the external connection terminal 61 are equal to one another (Len1=Len2=Len3). That is, the gate wiring is formed such that wiring inductances generated in the gate wiring for the semiconductor module 10-1 and the gate wiring for the semiconductor module 10-2, and a wiring inductance generated in the gate wiring for the semiconductor module 10-3 are equal to one another.

It is preferable to adjust wiring patterns to have substantially the same widths in forming the gate wiring in the multilayer substrate 300.

In FIG. 14, Len1$g$ is a wiring length of wiring from the external connection terminal 61 to the first signal terminal connection pattern 111-1. Len1$s$ is a wiring length of a combination of wiring from the second signal terminal connection pattern 113-1 to the junction P2 and wiring from the junction P2 to the external connection terminal 61. Len2$g$ is a wiring length of a combination of wiring from the external connection terminal 61 to the branch point Q2 and wiring from the branch point Q2 to the first signal terminal connection pattern 111-2. Len2$s$ is a wiring length of a combination of wiring from the second signal terminal connection pattern 113-2 to the junction P1 and wiring from the junction P1 to the external connection terminal 61. Len3$g$ is a wiring length of a combination of wiring from the external connection terminal 61 to the branch point Q1 and wiring from the branch point Q1 to the first signal terminal connection pattern 111-3. Len3$s$ is a wiring length of wiring from the second signal terminal connection pattern 113-3 to the external connection terminal 61.

In the third embodiment, the wiring is formed as described above, such that the wiring length of the gate wiring for the semiconductor module 10-1, the wiring length of the gate wiring for the semiconductor module 10-2, and the wiring length of the gate wiring for the semiconductor module 10-3 can be equal to one another. That is, the gate wiring is formed such that Len1=Len2=Len3 holds true. Since the gate wiring lengths of the semiconductor modules 10-1, 10-2, and 10-3 can be equal to one another, it is possible to reduce an imbalance in current generated among the semiconductor modules when the semiconductor modules are driven in parallel.

In the third embodiment, the wiring length of the gate wiring for the semiconductor module 10-1, the wiring length of the gate wiring for the semiconductor module 10-2, and the wiring length of the gate wiring for the semiconductor module 10-3 are equal to one another, such that the amounts of voltage drop due to the wiring inductances can be equal to one another, whereby it is possible to reduce an imbalance in current generated among the semiconductor modules when the semiconductor modules are driven in parallel.

In the third embodiment, the wiring to the first signal terminals of the semiconductor modules is formed in the two layers of the multilayer substrate 300, such that the gate wiring lengths of the semiconductor modules can be equal to one another.

In the third embodiment, the lengths of wiring are considered to be equal to one another if an imbalance in current among the semiconductor modules exists to such an extent as to have substantially no influence. Similarly, the inductances of wiring are considered to be equal to one another if an imbalance in current among the semiconductor modules exists to such an extent as to have substantially no influence.

In the third embodiment, the gate return wiring is formed in the first layer 301 of the multilayer substrate 300, and the output wiring is formed in the third layer 303 of the multilayer substrate 300. Alternatively, the output wiring may be formed in the first layer 301 of the multilayer substrate 300, and the gate return wiring may be formed in the third layer 303 of the multilayer substrate 300.

The semiconductor module parallel circuit according to the third embodiment includes: a first power semiconductor module; a second power semiconductor module; a third power semiconductor module; and a multilayer substrate that interconnects a plurality of the power semiconductor modules, each of the power semiconductor modules includes: a power semiconductor switching element; a first signal terminal connected to a gate potential of the power semiconductor switching element; and a second signal terminal connected to a source potential of the power semiconductor switching element, the multilayer substrate includes: an external connection terminal; a first signal terminal connection pattern for the first power semiconductor module, the first signal terminal connection pattern for the first power semiconductor module being connected to the first signal terminal of the first power semiconductor module; a second signal terminal connection pattern for the first power semiconductor module, the second signal terminal connection pattern for the first power semiconductor module being connected to the second signal terminal of the first power semiconductor module; a first signal terminal connection pattern for the second power semiconductor module, the first signal terminal connection pattern for the second power semiconductor module being connected to the first signal terminal of the second power semiconductor module; a second signal terminal connection pattern for the second power semiconductor module, the second signal terminal connection pattern for the second power semiconductor module being connected to the second signal terminal of the second power semiconductor module; a first signal terminal connection pattern for the third power semiconductor module, the first signal terminal connection pattern for the third power semiconductor module being connected to the first signal terminal of the third power semiconductor module; and a second signal terminal connection pattern for the third power semiconductor module, the second signal terminal connection pattern for the third power semiconductor module being connected to the second signal terminal of the third power semiconductor module, and an inductance of gate wiring for the first power semiconductor module from the external connection terminal to the first signal terminal connection pattern for the first power semiconductor module and from the second signal terminal connection pattern for the first power semiconductor module to the external connection terminal, an inductance of gate wiring for the second power semiconductor module from the external connection terminal to the first signal terminal connection pattern for the second power semiconductor module and from the second signal terminal connection pattern for the second power semiconductor module to the external connection terminal, and an inductance of gate wiring for the third power semiconductor module from the external connection terminal to the first signal terminal connection pattern for the third power semiconductor module and from the second signal terminal connection pattern for the third power semiconductor module to the external connection terminal are equal to one another, whereby it is possible to reduce an imbalance in current among the semiconductor modules.

Fourth Embodiment

Figure 15:
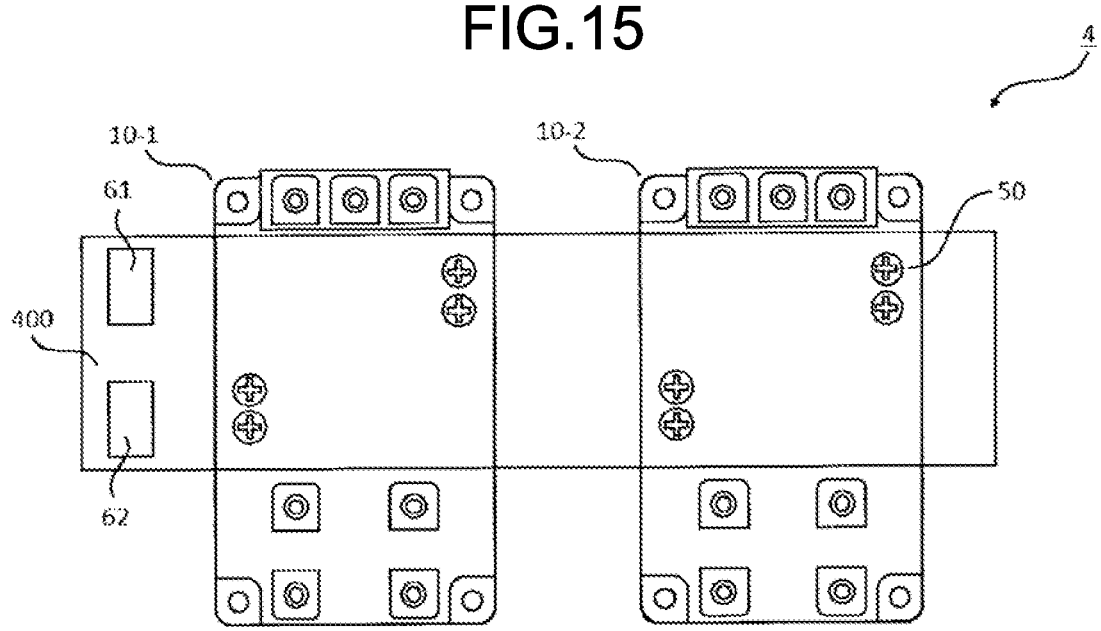
FIG. 15 is a view illustrating a semiconductor module parallel circuit in a fourth embodiment.
Figure 16:
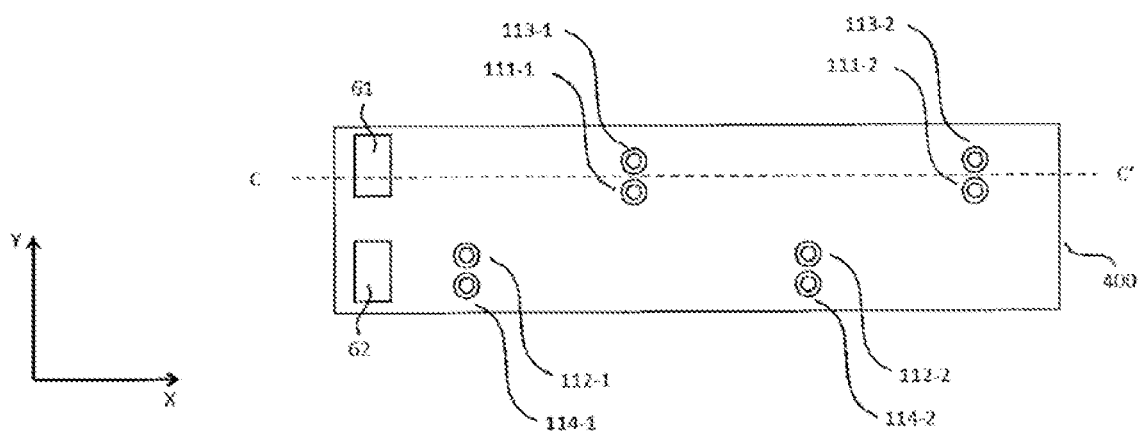
FIG. 16 is a view illustrating a multilayer substrate according to the fourth embodiment.
Figure 17:
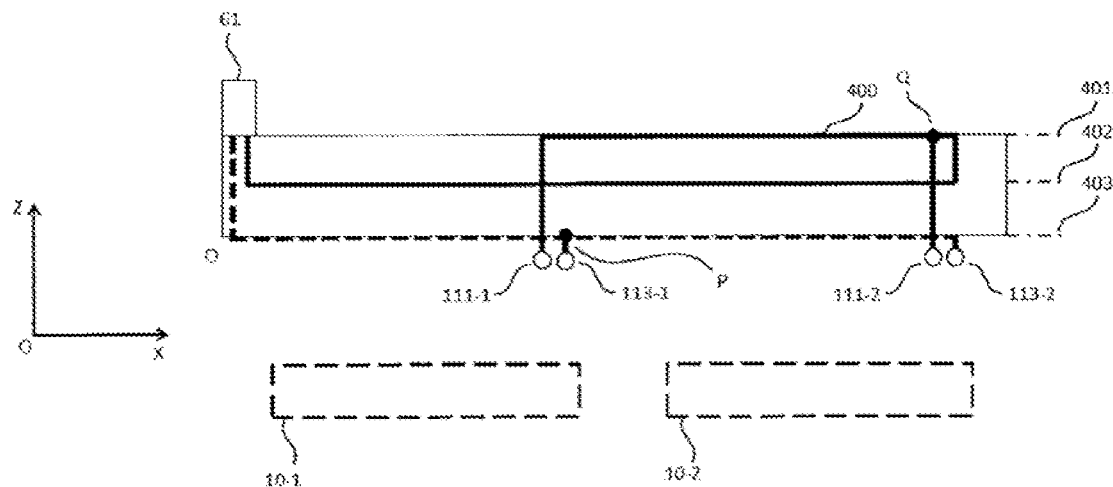
FIG. 17 is a schematic view of the semiconductor module parallel circuit according to the fourth embodiment.

A fourth embodiment described below gives an example in which interlayer distances of a multilayer substrate are equal to each other. A description will be made as to an example in which two semiconductor modules are disposed in parallel. FIG. 15 is a view illustrating a semiconductor module parallel circuit 4 of the fourth embodiment. FIG. 16 is a view illustrating a multilayer substrate 400 of the semiconductor module parallel circuit 4 in the fourth embodiment. FIG. 17 is a schematic view of a cross section of the multilayer substrate 400 of FIG. 16 taken along line C-C'. A basic configuration and each wiring connection are similar to those in the second embodiment. The fourth embodiment differs from the second embodiment in respects as will be described. In the multilayer substrate 400 of FIG. 17, an interlayer distance between a first layer 401 and a second layer 402 and an interlayer distance between the second layer 402 and a third layer 403 are formed to be equal to each other. That is, an interlayer distance between the layer having gate return wiring formed therein and the layer having gate forward wiring formed therein and an interlayer distance between the layer having the gate forward wiring formed therein and the layer having output wiring formed therein are formed to be equal to each other.

The interlayer distance between the layer having the gate return wiring formed therein and the layer having the gate forward wiring formed therein and the interlayer distance between the layer having the gate forward wiring formed therein and the layer having the output wiring formed therein are formed to be equal to each other, such that the influence of mutual inductances can be reduced.

A voltage drop due to a wiring inductance of the first layer 401 can be expressed by formula (7) below.

$$\Delta V1 = L1 \times (di_{L1}/dt) - M12 \times (di_{L1}/dt) - M13 \times (di_{L1}/dt) \qquad (7)$$

Similarly, a voltage drop due to a wiring inductance of the third layer 403 can be expressed by formula (8) below.

$$\Delta V3 = L3 \times (di_{L3}/dt) - M23 \times (di_{L3}/dt) - M13 \times (di_{L3}/dt) \qquad (8)$$

L1 represents a self-inductance of the first layer 401, L3 represents a self-inductance of the third layer 403, M12 represents a mutual inductance between the first layer 401 and the second layer 402, M23 represents a mutual inductance between the second layer 402 and the third layer 403, M13 represents a mutual inductance between the first layer 401 and the third layer 403, $di_{L1}/dt$ represents a time differential of a current flowing through the first layer 401, and $di_{L3}/dt$ represents a time differential of a current flowing through the third layer 403.

In the fourth embodiment, since the interlayer distance between the first layer 401 and the second layer 402 and the interlayer distance between the second layer 402 and the third layer 403 are formed to be equal to each other, formula (9) below holds true.

$$M12 = M23 = M \qquad (9)$$

Since a distance between the first signal terminal connection pattern 111-1 and the first signal terminal connection pattern 111-2 and a distance between the second signal terminal connection pattern 113-1 and the second signal terminal connection pattern 113-2 are formed to be equal to each other, a wiring length in the first layer 401 and a wiring length in the third layer 403 are equal to each other, and thus formula (10) below holds true.

$$L1 = L3 = L \qquad (10)$$

Since a current flowing through the first layer 401 and a current flowing through the third layer 403 are equal to each other, formula (11) below holds true.

$$di_{L1}/dt = di_{L3}/dt = di/dt \qquad (11)$$

From formulas (7) to (11), the voltage drops due to the wiring inductances of the first layer 401 and the third layer 403 are expressed by formulas (12) and (13) below.

$$\Delta V1 = L \times (di/dt) - M \times (di/dt) - M13 \times (di/dt) \qquad (12)$$

$$\Delta V3 = L \times (di/dt) - M \times (di/dt) - M13 \times (di/dt) \quad (13)$$

It can be seen from formulas (12) and (13) that the voltage drops due to the wiring inductances of the first layer 401 and the third layer 403 are equal to each other.

In the fourth embodiment, the interlayer distance between the first layer 401 and the second layer 402 and the interlayer distance between the second layer 402 and the third layer 403 are formed to be equal to each other, such that the influence of the mutual inductances can be reduced. Since the influence of the mutual inductances can be reduced, a wiring inductance of gate wiring for the semiconductor module 10-1 and a wiring inductance of gate wiring for the semiconductor module 10-2 can be equal to each other. Since the wiring inductance of the gate wiring for the semiconductor module 10-1 and the wiring inductance of the gate wiring for the semiconductor module 10-2 can be equal to each other, the amounts of voltage drops due to the wiring inductances can be equal to each other, and it is possible to reduce an imbalance in current generated between the semiconductor modules when the semiconductor modules are driven in parallel.

Although the fourth embodiment described above gives an example in which two semiconductor modules are disposed in parallel to each other, the influence of the mutual inductances can be similarly reduced even in a case where three semiconductor modules are disposed.

In the fourth embodiment, the lengths of wiring are considered to be equal to each other if an imbalance in current between the semiconductor modules exists to such an extent as to have substantially no influence. Similarly, the inductances of wiring are considered to be equal to each other if an imbalance in current between the semiconductor modules exists to such an extent as to have substantially no influence.

Fifth Embodiment

Figure 18:
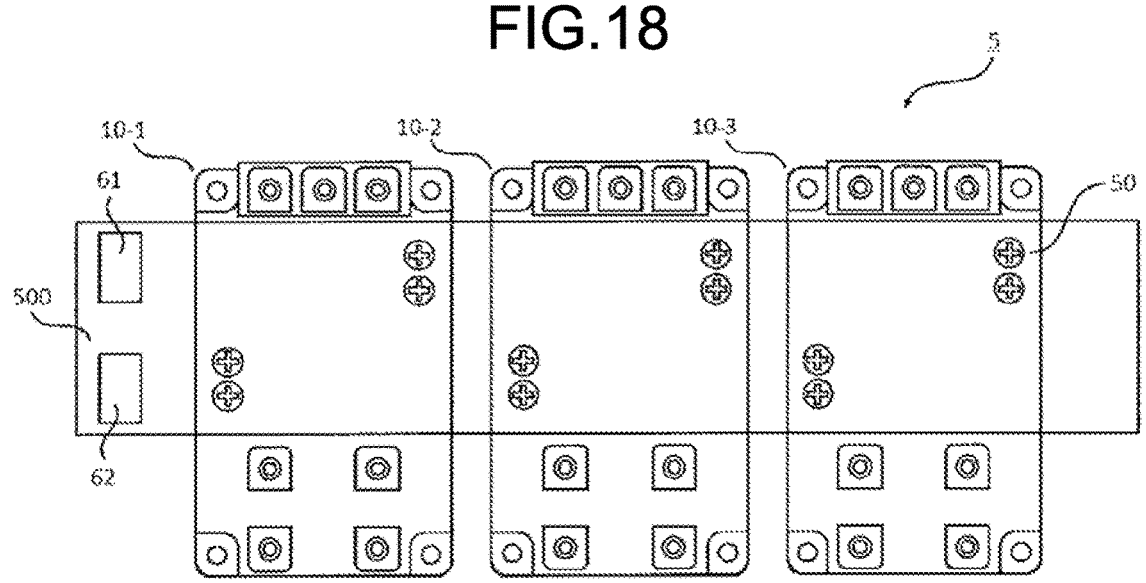
FIG. 18 is a view illustrating a semiconductor module parallel circuit in a fifth embodiment.
Figure 19:
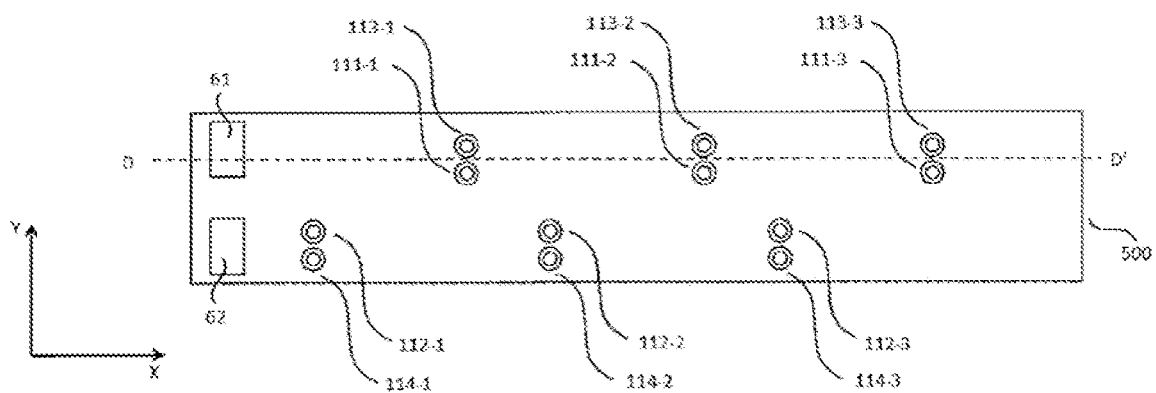
FIG. 19 is a view illustrating a multilayer substrate according to the fifth embodiment.

A fifth embodiment is an embodiment in which the influence of a wiring inductance is further reduced. The fifth embodiment described below gives an example in which three semiconductor modules are disposed in parallel to each other. FIG. 18 is a view illustrating a semiconductor module parallel circuit 5 according to the fifth embodiment. FIG. 19 is a view illustrating a multilayer substrate 500 of the semiconductor module parallel circuit 5 in the fifth embodiment.

Figure 20:
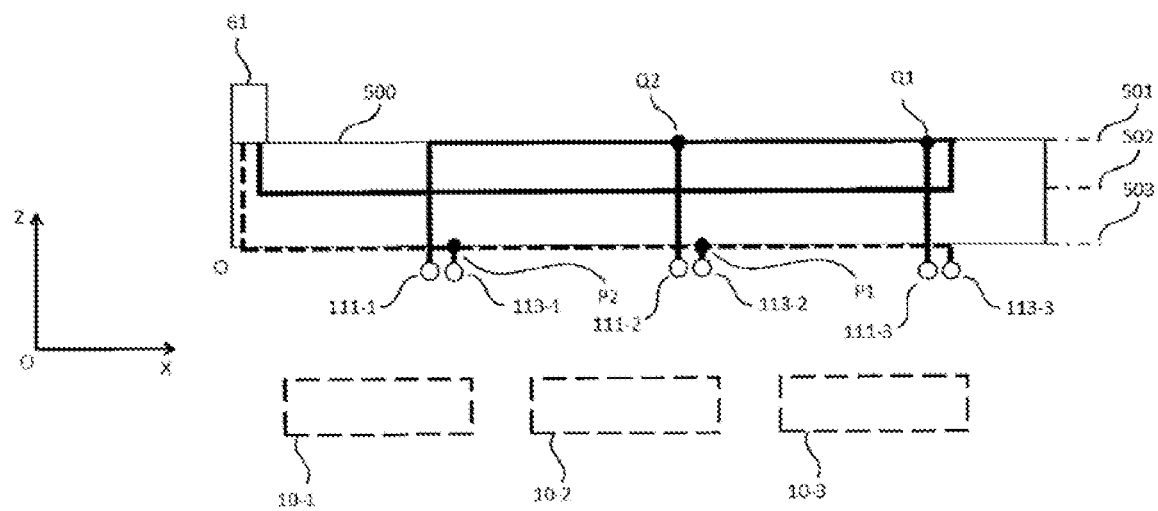
FIG. 20 is a schematic view of the semiconductor module parallel circuit according to the fifth embodiment.

FIG. 20 is a schematic view of a cross section of the multilayer substrate 500 of FIG. 19 taken along line D-D'. A basic configuration and each wiring connection are similar to those in the third embodiment. The fifth embodiment differs from the third embodiment in respects as will be described. For ease of description, a position of gate return wiring in the X direction corresponding to a position of the first signal terminal connection pattern 111-1 in the X direction is referred to as a branch point Q3. A position of the output wiring in the X direction corresponding to a position of the second signal terminal connection pattern 113-3 in the X direction is referred to as a junction P3.

In the gate return wiring formed in a first layer 501 of the multilayer substrate 500 of the fifth embodiment, a wiring pattern from the branch point Q1 to the branch point Q2 is formed to have a width larger than a width of a wiring pattern from the branch point Q2 to the branch point Q3. In the output wiring formed in a third layer 503 of the multilayer substrate 500, a wiring pattern from the junction P1 to the junction P2 is formed to have a width larger than a width of a wiring pattern from the junction P3 to the junction P1.

A gate drive current in the semiconductor module parallel circuit 5 will be described. A current input from the external connection terminal 61 flows through gate forward wiring formed in a second layer 502 of the multilayer substrate 500 and then through the gate return wiring formed in the first layer 501 of the multilayer substrate 500. Next, the current branches in the gate return wiring to provide flows of current into the first signal terminal connection patterns 111-1, 111-2, and 111-3.

One of the branched gate drive currents flows to the first signal terminal of the semiconductor module 10-1 via the first signal terminal connection pattern 111-1. Similarly, another of the branched gate drive currents flows to the first signal terminal of the semiconductor module 10-2 via the first signal terminal connection pattern 111-2, and the other of the branched gate drive currents flows to the first signal terminal of the semiconductor module 10-3 via the first signal terminal connection pattern 111-3. The gate drive current, which has branched off at the branch point Q1 of the gate return wiring, flows to the first signal terminal connection pattern 111-3. The gate drive current, which has branched off at the branch point Q2 of the gate return wiring, flows to the first signal terminal connection pattern 111-2.

Next, a current output from the second signal terminal of the semiconductor module 10-1 flows into the output wiring of the multilayer substrate 500 via the second signal terminal connection pattern 113-1. Similarly, a current output from the second signal terminal of the semiconductor module 10-2 flows into the output wiring of the multilayer substrate 500 via the second signal terminal connection pattern 113-2. A current output from the second signal terminal of the semiconductor module 10-3 flows into the output wiring of the multilayer substrate 500 via the second signal terminal connection pattern 113-3. The current output from the second signal terminal connection pattern 113-3 merges with the current output from the second signal terminal connection pattern 113-2 at the junction P1 of the output wiring. The currents output from the second signal terminal connection pattern 113-2 and the second signal terminal connection pattern 113-3 merge with the current output from the second signal terminal connection pattern 113-1 at the junction P2 of the output wiring. The currents merged together at the junction P2 is output from the external connection terminal 61.

Figure 21:
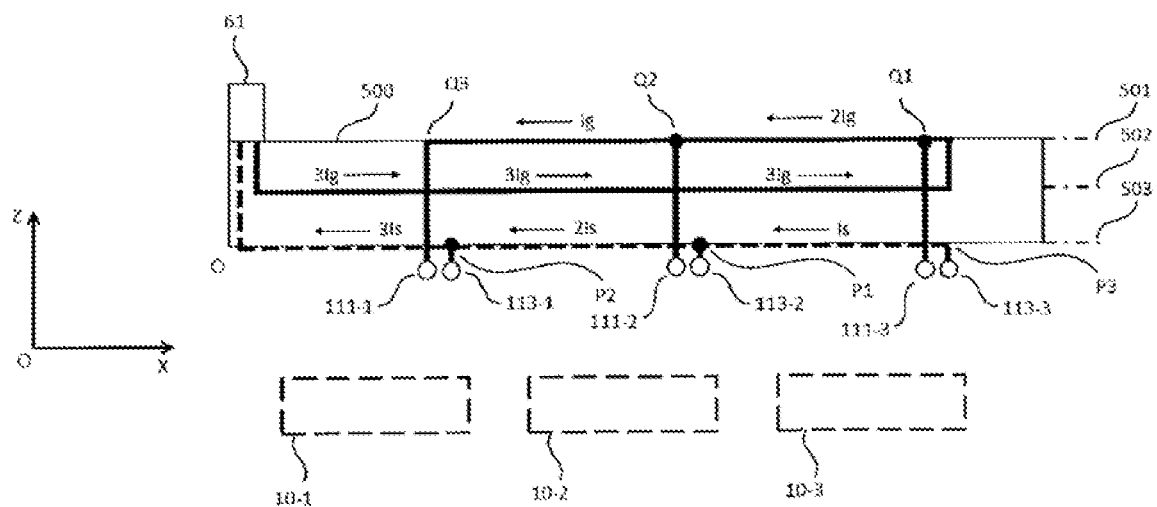
FIG. 21 is a view illustrating a gate drive current in the semiconductor module parallel circuit according to the fifth embodiment.

FIG. 21 is a view illustrating a gate drive current flowing through each layer of the multilayer substrate 500. When a current flowing through the gate forward wiring is denoted by $Ig_{123}$, a current flowing from the branch point Q3 to the first signal terminal connection pattern 111-1 is denoted by $I1g$, a current flowing from the branch point Q2 to the first signal terminal connection pattern 111-2 is denoted by $I2g$, and a current flowing from the branch point Q1 to the first signal terminal connection pattern 111-3 is denoted by $I3g$, formula (14) below holds true.

$$Ig_{123} = I1g + I2g + Ig3 \quad (14)$$

Currents input to the first signal terminals of the semiconductor modules 10-1, 10-2, and 10-3 can be approximated as in formula (15) below.

$$I1g = I2g = I3g = Ig \quad (15)$$

Formula (16) below is derived from formulas (14) and (15).

$$Ig_{123} = 3Ig \quad (16)$$

From formulas (15) and (16) above, the current flowing in the gate return wiring from the branch point Q2 to the first signal terminal connection pattern 111-1 is Ig. A current flowing from the branch point Q1 to the branch point Q2 is 2Ig.

Next, when a current flowing through the output wiring is denoted by $Is_{123}$, a current output from the second signal terminal connection pattern 113-3 is denoted by I3s, a current output from the second signal terminal connection pattern 113-2 is denoted by I2s, and a current output from the second signal terminal connection pattern 113-1 is denoted by I1s, formula (17) below holds true.

$$I1s+I2s+I3s=Is_{123} \quad (17)$$

Currents output from the second signal terminals of the semiconductor modules 10-1, 10-2, and 10-3 can be approximated as in formula (18) below.

$$I1s=I2s=I3s=Is \quad (18)$$

Formula (19) below is derived from formulas (17) and (18).

$$Is_{123}=3Is \quad (19)$$

From formulas (18) and (19), a current flowing in the output wiring from the second signal terminal connection pattern 113-3 to the junction P1 is Is. A current flowing from the junction P1 to the junction P2 is 2Is.

From the above description, a current flowing in the gate return wiring from the branch point Q2 to the branch point Q3 is Ig. The current flowing from the branch point Q1 to the branch point Q2 is 2Ig. The current flowing from the branch point Q1 to the branch point Q2 is about twice the current flowing from the branch point Q2 to the branch point Q3. In the gate return wiring, there occurs a difference in time-differentiated amount of current between the wiring from the branch point Q1 to the branch point Q2 and the wiring from the branch point Q2 to the branch point Q3. Similarly, in the output wiring, the current flowing from the junction P1 to the junction P2 is 2Is. A current flowing from the junction P3 to the junction P1 is Is. The current flowing from the junction P1 to the junction P2 is about twice the current flowing from the junction P3 to the junction P1. In the output wiring, there occurs a difference in time-differentiated amount of current between the wiring from the junction P1 to the junction P2 and the wiring from the junction P3 to the junction P1. There occurs a difference in time-differentiated amount of current in the wiring.

As described in the fourth embodiment, a voltage drop amount of wiring is expressed by the product of a self-inductance of wiring and a time-differentiated amount of current as in formula (20) below. In order to simplify the description, the influence of the mutual inductances is not considered here.

$$\Delta V = L \times (di/dt) \quad (20)$$

L represents a self-inductance of wiring, and di/dt represents a time-differentiated amount of current. As can be seen from formula (20), a different time-differentiated amount of current results in a different voltage drop amount.

In the gate return wiring of the multilayer substrate 500 of the fifth embodiment, the wiring pattern from the branch point Q1 to the branch point Q2 is formed to have a width larger than a width of the wiring pattern from the branch point Q2 to the branch point Q3. Increasing the wiring pattern width can reduce the self-inductance of wiring. That is, the wiring from the branch point Q1 to the branch point Q2 achieves a smaller self-inductance than the wiring from the branch point Q2 to the branch point Q3.

As can be seen from formula (20), the self-inductance of wiring is indicated by a first term of the right side of formula (20), and the time-differentiated amount of current is indicated by a second term of the right side of formula (20). The wiring from the branch point Q1 to the branch point Q2 provides a larger second term of the right side of formula (20) than the wiring from the branch point Q2 to the branch point Q3. However, since the width of the wiring pattern from the branch point Q1 to the branch point Q2 is larger than the width of the wiring pattern from the branch point Q2 to the branch point Q3, the first term of the right side of formula (20) can be reduced.

The above similarly applies to the output wiring. The wiring from the junction P1 to the junction P2 provides a larger second term of the right side of formula (20) than the wiring from the junction P3 to the junction P1. However, since the width of the wiring pattern from the junction P1 to the junction P2 is larger than the width of the wiring pattern from the junction P3 to the junction P1, the first term of the right side of formula (20) can be reduced.

In the fifth embodiment, the self-inductance of wiring and the time-differentiated amount of current are taken into consideration, thereby making it possible to reduce the difference in the amount of voltage drop due to the inductance of the wiring.

In the fifth embodiment, since the voltage drop amounts of gate wiring of the semiconductor module 10-1 and gate wiring of the semiconductor module 10-2 can be equal to each other, it is possible to reduce an imbalance in current generated between the semiconductor modules when the semiconductor modules are driven in parallel.

In the fifth embodiment, the wiring inductances are considered to be equal to each other if an imbalance in current between the semiconductor modules exists to such an extent as to have substantially no influence.

Note that, in the present invention, the respective embodiments can be freely combined, or the embodiments can be appropriately modified or omitted within the scope of the invention.

REFERENCE SIGNS LIST 1, 2, 3, 4, 5 semiconductor module parallel circuit; 10-1 semiconductor module; 10-2 semiconductor module; 10-3 semiconductor module; 10P first main terminal; 10N second main terminal; 10AC third main terminal; 11, 11-1, 11-2, 12, 12-1, 12-2 first signal terminal; 13, 13-1, 13-2, 14, 14-1, 14-2 second signal terminal; 20 package; 30, 30-1, 30-2 first semiconductor element; 40, 40-1, 40-2 second semiconductor element; 50 fastening member; 61, 62 external connection terminal; 71-1, 71-2 first connection terminal; 72-1, 72-2 second connection terminal; 100, 200, 300, 400, 500 multilayer substrate; 111-1, 111-2, 111-3, 112-1, 112-2, 112-3 first signal terminal connection pattern; 113-1, 113-2, 113-3, 114-1, 114-2, 114-3 second signal terminal connection pattern; 201, 301, 401, 501 first layer; 202, 302, 402, 502 second layer; 203, 303, 403, 503 third layer; D1, D2 drain terminal; S1, S2 source terminal.

The invention claimed is:

1. A semiconductor module parallel circuit comprising:
a first power semiconductor module;
a second power semiconductor module; and
a multilayer substrate to interconnect a plurality of the power semiconductor modules, wherein
each of the power semiconductor modules includes:

a power semiconductor switching element;
a first signal terminal connected to a gate potential of the power semiconductor switching element; and
a second signal terminal connected to a source potential of the power semiconductor switching element,
the multilayer substrate includes:
an external connection terminal;
a first signal terminal connection pattern for the first power semiconductor module, the first signal terminal connection pattern for the first power semiconductor module being connected to the first signal terminal of the first power semiconductor module;
a second signal terminal connection pattern for the first power semiconductor module, the second signal terminal connection pattern for the first power semiconductor module being connected to the second signal terminal of the first power semiconductor module;
a first signal terminal connection pattern for the second power semiconductor module, the first signal terminal connection pattern for the second power semiconductor module being connected to the first signal terminal of the second power semiconductor module; and
a second signal terminal connection pattern for the second power semiconductor module, the second signal terminal connection pattern for the second power semiconductor module being connected to the second signal terminal of the second power semiconductor module, and
an inductance of gate wiring for the first power semiconductor module from the external connection terminal to the first signal terminal connection pattern for the first power semiconductor module and from the second signal terminal connection pattern for the first power semiconductor module to the external connection terminal, and an inductance of gate wiring for the second power semiconductor module from the external connection terminal to the first signal terminal connection pattern for the second power semiconductor module and from the second signal terminal connection pattern for the second power semiconductor module to the external connection terminal are equal to each other, and wherein
wiring from the external connection terminal to the first signal terminal connection pattern for the first power semiconductor module and wiring from the external connection terminal to the first signal terminal connection pattern for the second power semiconductor module are formed in first and third layers of the multilayer substrate, and wiring from the second signal terminal connection pattern for the first power semiconductor module to the external connection terminal and wiring from the second signal terminal connection pattern for the second power semiconductor module to the external connection terminal are formed in a second layer of the multilayer substrate.

2. A semiconductor module parallel circuit comprising:
a first power semiconductor module;
a second power semiconductor module; and
a multilayer substrate to interconnect a plurality of the power semiconductor modules, wherein
each of the power semiconductor modules includes:
a power semiconductor switching element;
a first signal terminal connected to a gate potential of the power semiconductor switching element; and
a second signal terminal connected to a source potential of the power semiconductor switching element,
the multilayer substrate includes:
an external connection terminal;
a first signal terminal connection pattern for the first power semiconductor module, the first signal terminal connection pattern for the first power semiconductor module being connected to the first signal terminal of the first power semiconductor module;
a second signal terminal connection pattern for the first power semiconductor module, the second signal terminal connection pattern for the first power semiconductor module being connected to the second signal terminal of the first power semiconductor module;
a first signal terminal connection pattern for the second power semiconductor module, the first signal terminal connection pattern for the second power semiconductor module being connected to the first signal terminal of the second power semiconductor module; and
a second signal terminal connection pattern for the second power semiconductor module, the second signal terminal connection pattern for the second power semiconductor module being connected to the second signal terminal of the second power semiconductor module, and
a length of gate wiring for the first power semiconductor module from the external connection terminal to the first signal terminal connection pattern for the first power semiconductor module and from the second signal terminal connection pattern for the first power semiconductor module to the external connection terminal, and a length of gate wiring for the second power semiconductor module from the external connection terminal to the first signal terminal connection pattern for the second power semiconductor module and from the second signal terminal connection pattern for the second power semiconductor module to the external connection terminal are equal to each other, and wherein
wiring from the external connection terminal to the first signal terminal connection pattern for the first power semiconductor module and wiring from the external connection terminal to the first signal terminal connection pattern for the second power semiconductor module are formed in first and third layers of the multilayer substrate, and wiring from the second signal terminal connection pattern for the first power semiconductor module to the external connection terminal and wiring from the second signal terminal connection pattern for the second power semiconductor module to the external connection terminal are formed in a second layer of the multilayer substrate.

3. A semiconductor module connection substrate comprising:
an external connection terminal;
a first signal terminal connection pattern for a first power semiconductor module, the first signal terminal connection pattern for the first power semiconductor module being provided for connection to a first signal terminal of the first power semiconductor module;
a second signal terminal connection pattern for the first power semiconductor module, the second signal terminal connection pattern for the first power semiconductor module being provided for connection to a second signal terminal of the first power semiconductor module;
a first signal terminal connection pattern for a second power semiconductor module, the first signal terminal connection pattern for the second power semiconductor module being provided for connection to a first signal terminal of the second power semiconductor module; and a second signal terminal connection pattern for the second power semiconductor module, the second signal terminal connection pattern for the second power semiconductor module being provided for connection to a second signal terminal of the second power semiconductor module, wherein an inductance of gate wiring for the first power semiconductor module from the external connection terminal to the first signal terminal connection pattern for the first power semiconductor module and from the second signal terminal connection pattern for the first power semiconductor module to the external connection terminal, and an inductance of gate wiring for the second power semiconductor module from the external connection terminal to the first signal terminal connection pattern for the second power semiconductor module and from the second signal terminal connection pattern for the second power semiconductor module to the external connection terminal are equal to each other, and wherein wiring from the external connection terminal to the first signal terminal connection pattern for the first power semiconductor module and wiring from the external connection terminal to the first signal terminal connection pattern for the second power semiconductor module are formed in first and third layers of the multilayer substrate, and wiring from the second signal terminal connection pattern for the first power semiconductor module to the external connection terminal and wiring from the second signal terminal connection pattern for the second power semiconductor module to the external connection terminal are formed in a second layer of the multilayer substrate.

* * * * *